(12) United States Patent  
Maejima et al.

(10) Patent No.: US 8,472,253 B2  
(45) Date of Patent: Jun. 25, 2013

(54) SEMICONDUCTOR MEMORY DEVICE

(75) Inventors: Hiroshi Maejima, Tokyo (JP); Mikihiko Ito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 13/240,248

(22) Filed: Sep. 22, 2011

(65) Prior Publication Data

US 2012/0092928 A1 Apr. 19, 2012

(30) Foreign Application Priority Data

Sep. 22, 2010 (JP) ................. P2010-212716

(51) Int. Cl.
*G11C 11/34* (2006.01)
*G11C 16/04* (2006.01)
*G11C 5/14* (2006.01)
*G11C 5/02* (2006.01)
*G11C 5/06* (2006.01)

(52) U.S. Cl.
USPC ............ 365/185.11; 365/185.05; 365/189.09; 365/51; 365/63; 365/226

(58) Field of Classification Search
USPC .............. 365/185.05, 185.11, 51, 63, 189.09, 365/226
See application file for complete search history.

(56) References Cited

U.S. PATENT DOCUMENTS

| 6,233,176 | B1 * | 5/2001 | Masuoka ................. 365/185.14 |
| 6,992,946 | B2 * | 1/2006 | Ooishi ........................... 365/226 |
| 7,151,686 | B2 | 12/2006 | Sugimae et al. |
| 7,898,851 | B2 | 3/2011 | Maejima et al. |
| 2009/0180320 | A1 * | 7/2009 | Torii et al. ................. 365/185.05 |
| 2009/0180321 | A1 * | 7/2009 | Torii ........................ 365/185.05 |
| 2012/0033521 | A1 * | 2/2012 | Nakamura et al. ............ 365/226 |

FOREIGN PATENT DOCUMENTS

JP 2005-100538 4/2005

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A semiconductor memory device includes: a memory-cell array provided between a first region and a second region, and including a plurality of memory cells; a first row decoder and a second row decoder; a first power line provided in the first region; a second power line provided in the first region; a first power-supply circuit configured to supply the first voltage to the first power line and to the second power line; a first switching circuit; and a second switching circuit. In a write operation, the first switching circuit connects the first power line and the first power-supply circuit to each other whereas the second switching circuit disconnects the second power line and the first power-supply circuit from each other.

11 Claims, 16 Drawing Sheets

Fig. 13
(a)
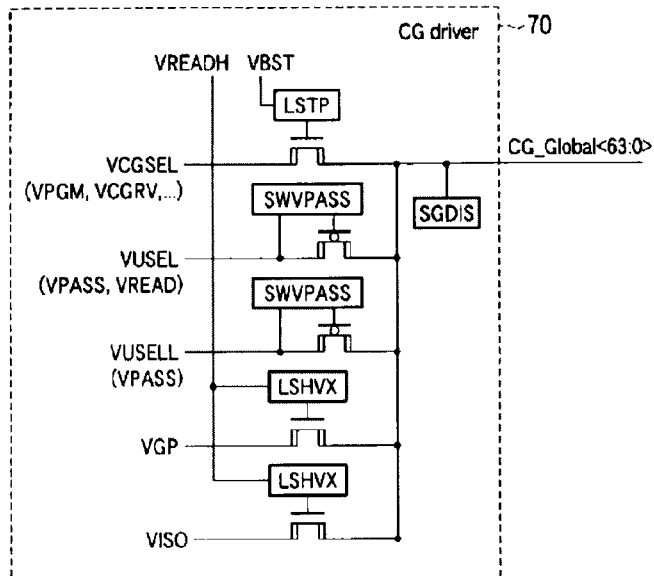
(b)
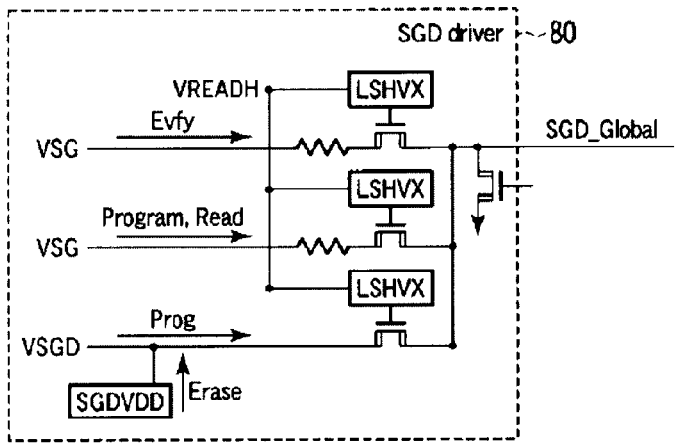
(c)
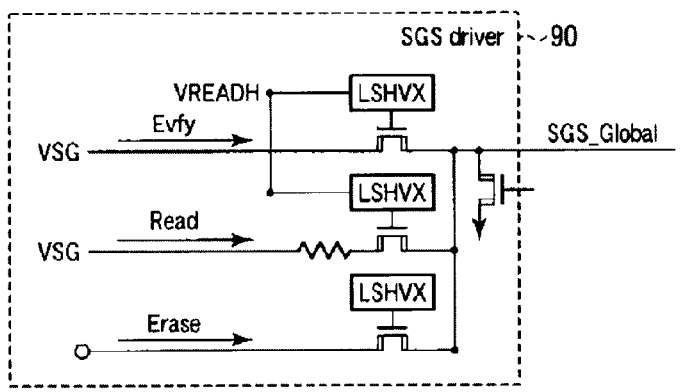

Fig. 15
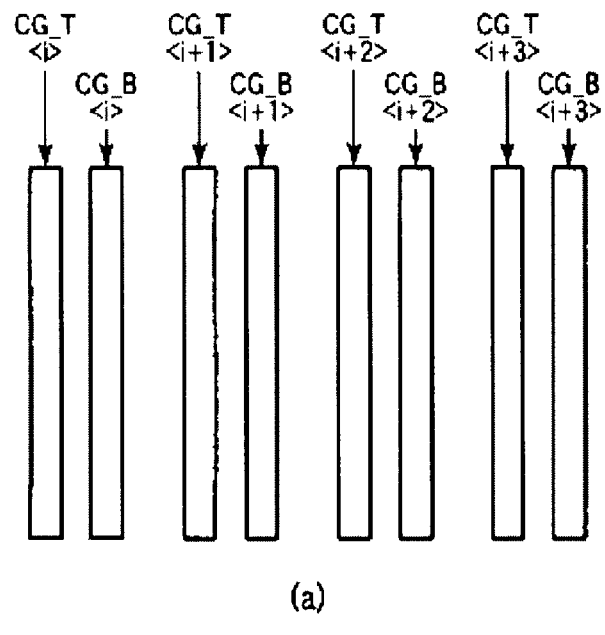
(a)
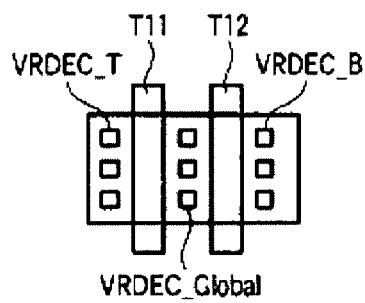
(b)
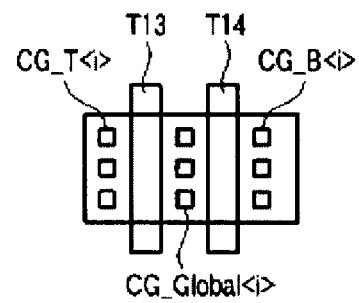
(c)

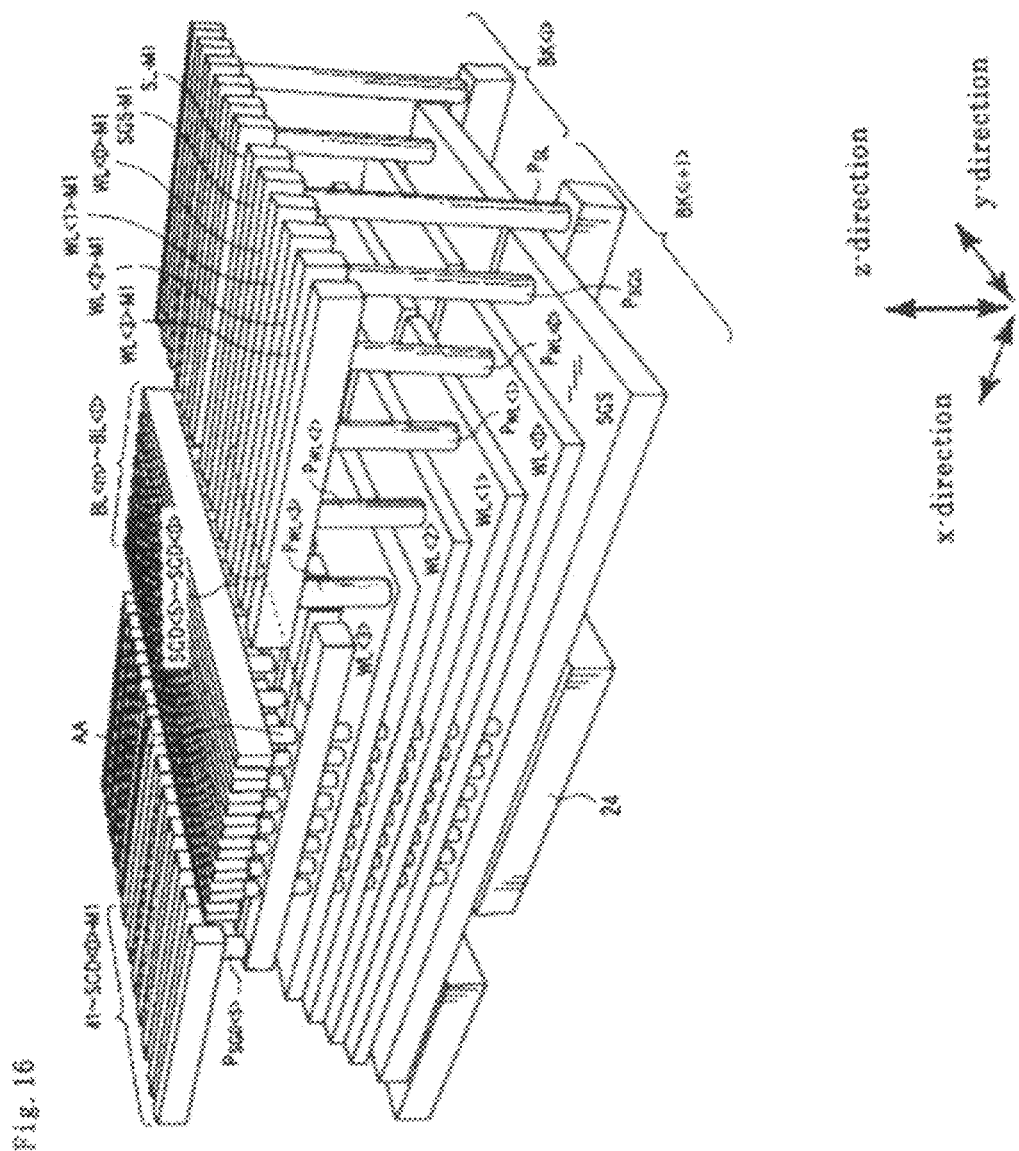

US 8,472,253 B2

SEMICONDUCTOR MEMORY DEVICE

CROSS-REFERENCE TO RELATED APPLICATIONS

This application is based upon and claims the benefit of priority from the prior Japanese Patent Application No. 2010-212716, filed Sep. 22, 2010, the entire contents of which are incorporated herein by reference.

BACKGROUND OF THE INVENTION

1. Field of the Invention

The present invention relates to a nonvolatile semiconductor memory device. For example, the present invention relates to an NAND flash memory.

2. Description of the Related Art

In designing a memory such as a nonvolatile semiconductor memory device, reduction of area, achievement of higher speed, and reduction of current consumption are universal problems. For example, in designing a row-system circuit in an NAND flash memory, it is preferable to find out an optimal solution not only for the row-system circuit but also for an overall system including a pump serving as a voltage-supply source to the row system.

In a conventional NAND flash memory, a power line to supply a voltage for block decode to row decoders and a signal line to supply a voltage to word lines are arranged in a row-decoder array provided on one side of a memory-cell array. The power line and the signal line are not divided on the one side of the memory-cell array, but are shared by all the row decoders provided on the one side of the memory-cell array.

However, when the power line and the signal line are shared by all the row decoders, the load capacity of the pump circuit increases to supply source to the power line or the signal line, and the stress on the switching circuit (driver) increases to transfer the voltage to the power line or the signal line (see, for example, Japanese Patent Application Publication No. 2005-100538).

BRIEF SUMMARY OF THE INVENTION

A semiconductor memory device according to an aspect of the present invention includes: a memory-cell array provided between a first region and a second region, and including a plurality of memory cells connected to a plurality of word lines; a first row decoder and a second row decoder, both provided in the first region, and each configured to select a word line from the plurality of word lines; a first power line provided in the first region, and configured to transfer a first voltage to the first row decoder; a second power line provided in the first region, and configured to transfer the first voltage to the second row decoder; a first power-supply circuit configured to supply the first voltage to the first power line and to the second power line; a first switching circuit configured to switch between connection and disconnection between the first power line and the first power-supply circuit; and a second switching circuit configured to switch between connection and disconnection between the second power line and the first power-supply circuit, wherein in a write operation, the first switching circuit connects the first power line and the first power-supply circuit to each other whereas the second switching circuit disconnects the second power line and the first power-supply circuit from each other.

BRIEF DESCRIPTION OF THE SEVERAL VIEWS OF THE DRAWINGS

FIGS. 13A to 13C show circuit diagrams illustrating the configurations of the driver according to the first and the second embodiments.

FIGS. 15A to 15C show diagrams illustrating layouts of signal lines and a switching circuit according to the first and the second embodiments.

FIG. 16 is a perspective view illustrating a NAND flash memory using what is known as the BiCS technique.

DETAILED DESCRIPTION OF THE INVENTION

Figure 1:
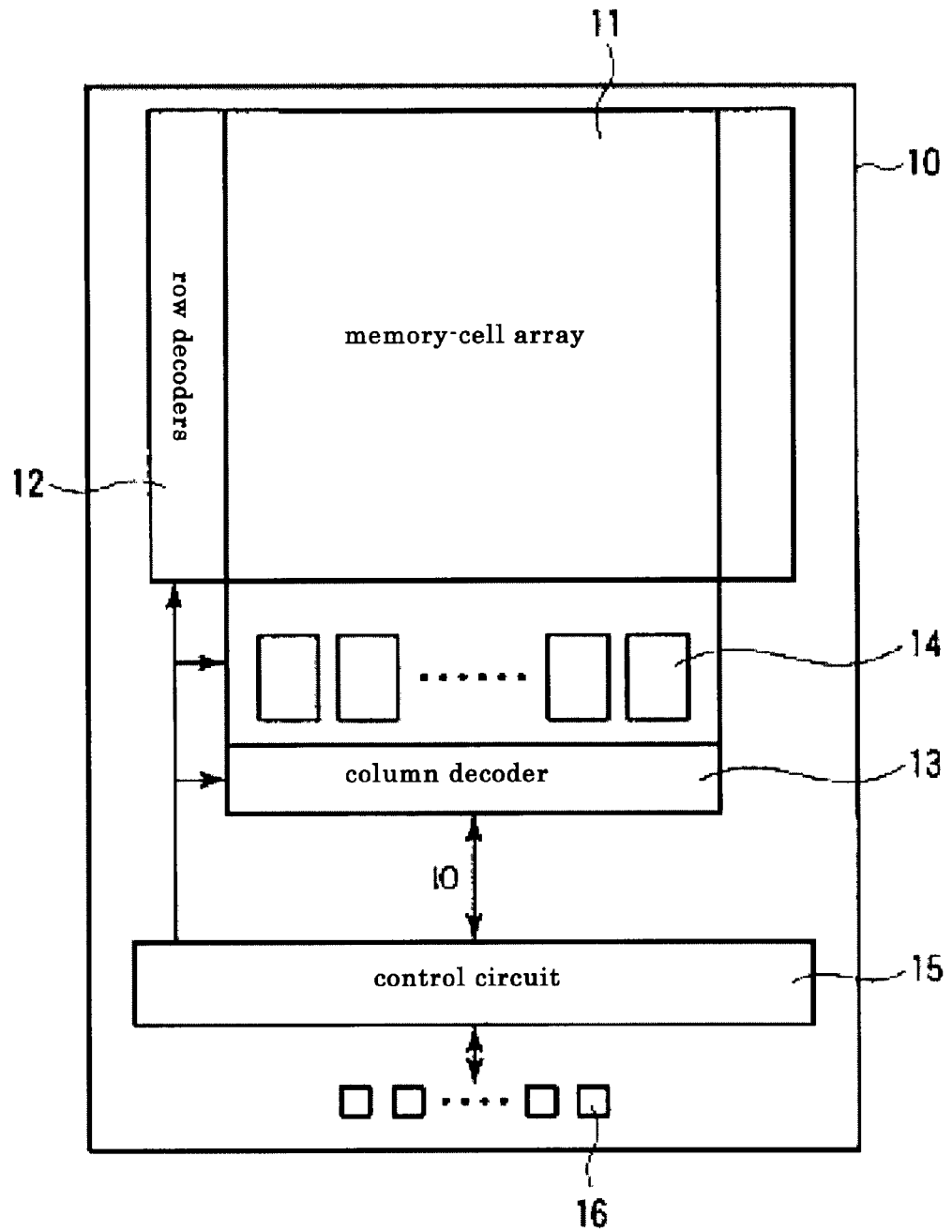
FIG. 1 is a block diagram illustrating an overall configuration of a NAND flash memory according to a first embodiment.

Nonvolatile semiconductor memory devices of some embodiments are described below by referring to the drawings. Hereinbelow, a NAND flash memory is taken up as an example of a nonvolatile semiconductor memory device. In the following description, the same portions are denoted by the same reference numerals throughout the drawings.

[1] First Embodiment

A NAND flash memory of a first embodiment is firstly described below.

[1-1] Overall Configuration

FIG. 1 is a block diagram illustrating an overall configuration of a NAND flash memory according to the first embodiment.

As FIG. 1 shows, a NAND flash memory 10 is formed on a semiconductor substrate, and includes a memory-cell array 11, row decoders 12, a column decoder 13, sense amplifiers 14, a control circuit 15, and external terminals 16.

The memory-cell array 11 includes plural blocks in each of which plural memory cells are arranged in a matrix shape. The memory-cell array 11 is provided between the two row decoders 12.

Each row decoder 12 selects a particular one of the plural blocks within the memory-cell array 11 in accordance with the address. To put it differently, the row decoder 12 selects the word line in a one block from the plural word lines in accordance with the address. The column decoder 13 selects, in accordance with the address, a one bit line from the plural bit lines connected to the memory cells in the memory-cell array 11.

Each sense amplifier 14 includes a read buffer and a write buffer. The sense amplifier 14 reads data stored in the memory cell through the read buffer, and writes data into the memory cell through the write buffer. The control circuit 15 includes a core control circuit, a sequencer, and the like. The control circuit 15 controls the operations of the row decoders 12, the column decoder 13, and the sense amplifiers 14.

The control circuit 15 outputs addresses and control signals to the row decoders 12, the column decoder 13, and the sense amplifiers 14. Write data are inputted into the external terminals 16, and are stored in the memory cells through the control circuit 15, the column decoder 13, and the sense amplifiers 14. The data read by the sense amplifiers 14 from the memory cells are outputted from the external terminals 16 through the read buffer, the column decoder 13, and the control circuit 15.

[1-2] Configurations of Power Lines and Signal Lines Connected to Row-Decoders

Figure 2:
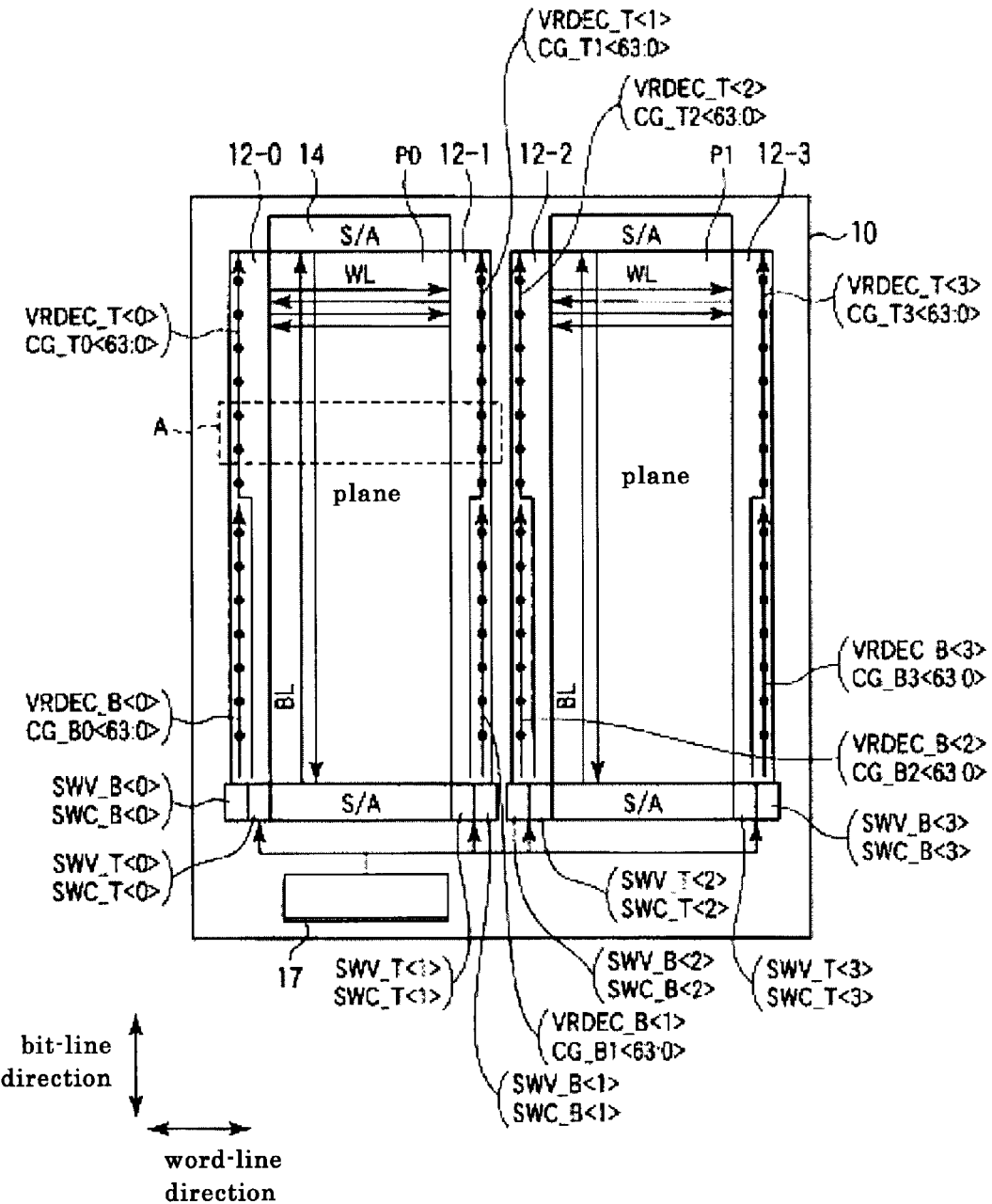
FIG. 2 is a schematic diagram illustrating a power line and a signal line connected to row decoders of the NAND flash memory according to the first embodiment.

FIG. 2 is a schematic diagram illustrating a power line and a signal line connected to row decoders of the NAND flash memory according to the first embodiment.

As FIG. 2 shows, the memory-cell array 11 includes plural planes. To be specific, two planes P0 and P1 are shown in FIG. 2. Each of the planes P0 and P1 includes plural blocks. Each block includes plural memory cells that are provided at the intersections of word lines WL and bit lines on a one-to-one. As a result, the plural memory cells are arranged in matrix. Each memory cell includes a nonvolatile memory-cell transistor having a floating gate and a control gate provided on the floating gate with an inter-gate insulator film interposed therebetween.

On a first end (on the left end in FIG. 2) of the plane P0, plural row decoders 12-0 are provided one next to another. On the other hand, on a second end (on the right end in FIG. 2) of the plane P0, plural row decoders 12-1 are provided one next to another. The row decoders 12-0 are provided corresponding to the blocks included in the plane P0, respectively. The row decoders 12-1 are also provided corresponding to the blocks included in the plane P0, respectively. Note that the row decoders 12-0 on the first-end side and the row decoders 12-1 on the second-end side are alternately connected to their corresponding blocks in the plane P0.

Likewise, on a first end (on the left end in FIG. 2) of the plane P1, plural row decoders 12-2 are provided one next to another. On the other hand, on a second end (on the right end in FIG. 2) of the plane P1, plural row decoders 12-3 are provided one next to another. The row decoders 12-2 are provided corresponding to the blocks included in the plane P1, respectively. The row decoders 12-3 are also provided corresponding to the blocks included in the plane P1, respectively. Note that the row decoders 12-2 on the first-end side and the row decoders 12-3 on the second-end side are alternately connected to their corresponding blocks in the plane P1.

Hereinbelow, a description is given of power lines VRDEC configured to supply a program high voltage VPGMH, which is a voltage higher than a program voltage, to the row decoders.

A power line VRDEC_T<0> and a power line VRDEC_B<0> are provided on the first-end side of the plane P0. The power line VRDEC_T<0> is connected to a group of the row decoders located on the top side among the plural row decoders 12-0, and the power line VRDEC_B<0> is connected to a group of the row decoders located on the bottom side among the plural row decoders 12-0.

A row-system peripheral circuit 17 is provided near the planes P0 and P1. Both the power line VRDEC_T<0> and the power line VRDEC_B<0> are connected to the output terminal of the row-system peripheral circuit 17. A switching circuit SWV_T<0> is connected between the row-system peripheral circuit 17 and the power line VRDEC_T<0>. A switching circuit SWV_B<0> is connected between the row-system peripheral circuit 17 and the power line VRDEC_B<0>.

The program high voltage VPGMH, which is a voltage higher than the program voltage VPGM, is transferred to the row decoders 12-0 through the power line VRDEC_T<0> and the VRDEC_B<0>. The switching circuit SWV_T<0> either connects or disconnects the row-system peripheral circuit 17 and the power line VRDEC_T<0>, and thereby controls the supply of the program high voltage VPGMH to the row-decoder group on the top side. The switching circuit SWV_B<0> either connects or disconnects the row-system peripheral circuit 17 and the power line VRDEC_B<0>, and thereby controls the supply of the program high voltage VPGMH to the row-decoder group on the bottom side.

In addition, a power line VRDEC_T<1> and a power line VRDEC_B<1> are provided on the second-end side of the plane P0. The power line VRDEC_T<1> is connected to a group of the row decoders located on the top side among the plural row decoders 12-1. Of all the plural row decoders 12-1, and the power line VRDEC_B<1> is connected to a group of the row decoders located on the bottom side among the plural row decoders 12-1.

Both the power line VRDEC_T<1> and the power line VRDEC_B<1> are connected to the output terminal of the row-system peripheral circuit 17. A switching circuit SWV_T<1> is connected between the row-system peripheral circuit 17 and the power line VRDEC_T<1>. A switching circuit SWV_B<1> is connected between the row-system peripheral circuit 17 and the power line VRDEC_B<1>.

The program high voltage VPGMH, which is a voltage higher than the program voltage VPGM, is transferred to the row decoders 12-1 through the power line VRDEC_T<1> and the VRDEC_B<1>. The switching circuit SWV_T<1> either connects or disconnects the row-system peripheral circuit 17 and the power line VRDEC_T<1>, and thereby controls the supply of the program high voltage VPGMH to the row-decoder group on the top side. The switching circuit SWV_B<1> either connects or disconnects the row-system peripheral circuit 17 and the power line VRDEC_B<1>, and thereby controls the supply of the program high voltage VPGMH to the row-decoder group on the bottom side.

In addition, a power line VRDEC_T<2> and a power line VRDEC_B<2> are provided on the first-end side of the plane P1. The power line VRDEC_T<2> is connected to a group of the row decoders located on the top side among the plural row decoders 12-2, and the power line VRDEC_B<2> is connected to a group of the row decoders located on the bottom side among the plural row decoders 12-2.

Both the power line VRDEC_T<2> and the power line VRDEC_B<2> are connected to the output terminal of the row-system peripheral circuit 17. A switching circuit SWV_T<2> is connected between the row-system peripheral circuit 17 and the power line VRDEC_T<2>. A switching circuit SWV_B<2> is connected between the row-system peripheral circuit 17 and the power line VRDEC_B<2>.

The program high voltage VPGMH, which is a voltage higher than the program voltage VPGM, is transferred to the row decoders 12-2 through the power line VRDEC_T<2> and the VRDEC_B<2>. The switching circuit SWV_T<2> either connects or disconnects the row-system peripheral circuit 17 and the power line VRDEC_T<2>, and thereby controls the supply of the program high voltage VPGMH to the row-decoder group on the top side. The switching circuit SWV_B<2> either connects or disconnects the row-system peripheral circuit 17 and the power line VRDEC_B<2>, and thereby controls the supply of the program high voltage VPGMH to the row-decoder group on the bottom side.

In addition, a power line VRDEC_T<3> and a power line VRDEC_B<3> are provided on the second-end side of the plane P1. The power line VRDEC_T<3> is connected to a group of the row decoders located on the top side among the plural row decoders 12-3, and the power line VRDEC_B<3> is connected to a group of the row decoders located on the bottom side among the plural row decoders 12-3.

Both the power line VRDEC_T<3> and the power line VRDEC_B<3> are connected to the output terminal of the row-system peripheral circuit 17. A switching circuit SWV_T<3> is connected between the row-system peripheral circuit 17 and the power line VRDEC_T<3>. A switching circuit SWV_B<3> is connected between the row-system peripheral circuit 17 and the power line VRDEC_B<3>.

The program high voltage VPGMH, which is a voltage higher than the program voltage VPGM, is transferred to the row decoders 12-3 through the power line VRDEC_T<3> and the VRDEC_B<3>. The switching circuit SWV_T<3> either connects or disconnects the row-system peripheral circuit 17 and the power line VRDEC_T<3>, and thereby controls the supply of the program high voltage VPGMH to the row-decoder group on the top side. The switching circuit SWV_B<3> either connects or disconnects the row-system peripheral circuit 17 and the power line VRDEC_B<3>, and thereby controls the supply of the program high voltage VPGMH to the row-decoder group on the bottom side.

Next, a description is given of signal lines CG configured to supply the program voltage to the word lines.

A signal line CG_T0<63:0> and a signal line CG_B0<63:0> are provided on the first-end side of the plane P0. In this embodiment, each block includes 64 word lines, and 64 signal lines are connected to those 64 word lines, respectively. Of all the plural row decoders 12-0, The signal line CG_T0<63:0> is connected to a group of the row decoders located on the top side among the plural row decoders 12-0, and the signal line CG_B0<63:0> is connected to a group of the row decoders located on the bottom side among the plural row decoders 12-0.

Both the signal line CG_T0<63:0> and the signal line CG_B0<63:0> are connected to the output terminal of the row-system peripheral circuit 17. A switching circuit SWC_T<0> is connected between the row-system peripheral circuit 17 and the signal line CG_T0<63:0>. A switching circuit SWC_B<0> is connected between the row-system peripheral circuit 17 and the signal line CG_B0<63:0>.

A voltage to be applied to the word lines, which is either the program voltage VPGM or an intermediate voltage VPASS, is transferred to the row decoders 12-0 through the signal line CG_T0<63:0> and the signal line CG_B0<63:0>. The switching circuit SWC_T<0> either connects or disconnects the row-system peripheral circuit 17 and the signal line CG_T0<63:0>, and thereby controls the supply of either the program voltage VPGM or the intermediate voltage VPASS to the row-decoder group on the top side. The switching circuit SWC_B<0> either connects or disconnects the row-system peripheral circuit 17 and the signal line CG_B0<63:0>, and thereby controls the supply of either the program voltage VPGM or the intermediate voltage VPASS to the row-decoder group on the bottom side.

Moreover, a signal line CG_T1<63:0> and a signal line CG_B1<63:0> are provided on the second-end side of the plane P0. The signal line CG_T1<63:0> is connected to a group of the row decoders located on the top side among the plural row decoders 12-1, and the signal line CG_B1<63:0> is connected to a group of the row decoders located on the bottom side among the plural row decoders 12-1.

Both the signal line CG_T1<63:0> and the signal line CG_B1<63:0> are connected to the output terminal of the row-system peripheral circuit 17. A switching circuit SWC_T<1> is connected between the row-system peripheral circuit 17 and the signal line CG_T1<63:0>. A switching circuit SWC_B<1> is connected between the row-system peripheral circuit 17 and the signal line CG_B1<63:0>.

A voltage to be applied to the word lines, which is either the program voltage VPGM or an intermediate voltage VPASS, is transferred to the row decoders 12-1 through the signal line CG_T1<63:0> and the signal line CG_B1<63:0>. The switching circuit SWC_T<1> either connects or disconnects the row-system peripheral circuit 17 and the signal line CG_T1<63:0>, and thereby controls the supply of either the program voltage VPGM or the intermediate voltage VPASS to the row-decoder group on the top side. The switching circuit SWC_B<1> either connects or disconnects the row-system peripheral circuit 17 and the signal line CG_B1<63:0>, and thereby controls the supply of either the program voltage VPGM or the intermediate voltage VPASS to the row-decoder group on the bottom side.

Further, a signal line CG_T2<63:0> and a signal line CG_B2<63:0> are provided on the first-end side of the plane P1. The signal line CG_T2<63:0> is connected to a group of the row decoders located on the top side among the plural row decoders 12-2, and the signal line CG_B2<63:0> is connected to a group of the row decoders located on the bottom side among the plural row decoders 12-2.

Both the signal line CG_T2<63:0> and the signal line CG_B2<63:0> are connected to the output terminal of the row-system peripheral circuit 17. A switching circuit SWC_T<2> is connected between the row-system peripheral circuit 17 and the signal line CG_T2<63:0>. A switching circuit SWC_B<2> is connected between the row-system peripheral circuit 17 and the signal line CG_B2<63:0>.

A voltage to be applied to the word lines, which is either the program voltage VPGM or an intermediate voltage VPASS, is transferred to the row decoders 12-2 through the signal line CG_T2<63:0> and the signal line CG_B2<63:0>. The switching circuit SWC_T<2> either connects or disconnects the row-system peripheral circuit 17 and the signal line CG_T2<63:0>, and thereby controls the supply of either the program voltage VPGM or the intermediate voltage VPASS to the row-decoder group on the top side. The switching circuit SWC_B<2> either connects or disconnects the row-system peripheral circuit 17 and the signal line CG_B2<63:

0>, and thereby controls the supply of either the program voltage VPGM or the intermediate voltage VPASS to the row-decoder group on the bottom side.

Furthermore, a signal line CG_T3<63:0> and a signal line CG_B3<63:0> are provided on the second-end side of the plane P1. The signal line CG_T3<63:0> is connected to a group of the row decoders located on the top side among the plural row decoders 12-3, and the signal line CG_B3<63:0> is connected to a group of the row decoders located on the bottom side among the plural row decoders 12-3.

Both the signal line CG_T3<63:0> and the signal line CG_B3<63:0> are connected to the output terminal of the row-system peripheral circuit 17. A switching circuit SWC_T<3> is connected between the row-system peripheral circuit 17 and the signal line CG_T3<63:0>. A switching circuit SWC_B<3> is connected between the row-system peripheral circuit 17 and the signal line CG_B3<63:0>.

A voltage to be applied to the word lines, which is either the program voltage VPGM or an intermediate voltage VPASS, is transferred to the row decoders 12-3 through the signal line CG_T3<63:0> and the signal line CG_B3<63:0>. The switching circuit SWC_T<3> either connects or disconnects the row-system peripheral circuit 17 and the signal line CG_T3<63:0>, and thereby controls the supply of either the program voltage VPGM or the intermediate voltage VPASS to the row-decoder group on the top side. The switching circuit SWC_B<3> either connects or disconnects the row-system peripheral circuit 17 and the signal line CG_B3<63:0>, and thereby controls the supply of either the program voltage VPGM or the intermediate voltage VPASS to the row-decoder group on the bottom side.

Next, a description is given of the write operation, the write-verify operation, and the read operation.

At the time of the write operation, the write-verify operation or the read operation, a block is selected in accordance with the inputted address by the row decoders (hereinafter, referred to as the selected block). Then, the switching circuits connect the row-system peripheral circuit 17 to both the power line VRDEC and the signal line CG that are connected to the row-decoder group including the row decoders corresponding to the selected block (hereinafter, referred to as the row-decoder group corresponding to the selected block). Thereby, any of the program high voltage VPGMH, the program voltage VPGM (or the intermediate voltage VPASS), a read high voltage VREADH, and a read voltage VREAD (or an intermediate voltage VCGRV) is supplied to the row-decoder group corresponding to the selected block.

On the other hand, the switching circuits disconnect the row-system peripheral circuit 17 from both the power line VRDEC and the signal line CG that are connected to each row-decoder group that does not correspond to the selected block (hereinafter, referred to as the row-decoder group corresponding to the non-selected block). Thereby, none of the program high voltage VPGMH, the program voltage VPGM (or the intermediate voltage VPASS), the read high VREADH, and the read voltage VREAD (or the intermediate voltage VCGRV) does not be supplied to the row-decoder group.

The sense amplifiers (S/A) 14 are provided at the top end and the bottom end of the planes P0 and P1. In addition, the row-system peripheral circuit 17 outputs control signals and addresses to the row decoders and the sense amplifiers.

Note that two divided power lines VRDEC and two divided signal line CG are provided in either side of the memory-cell array of this embodiment, but this is not the only possible configuration. Three, four, or more divided power lines VRDEC and three, four, or more divided signal lines CG may be provided in either side of the memory-cell array.

[1-3] Details of Row Decoders, Power Lines, and Signal Lines

Figure 3:
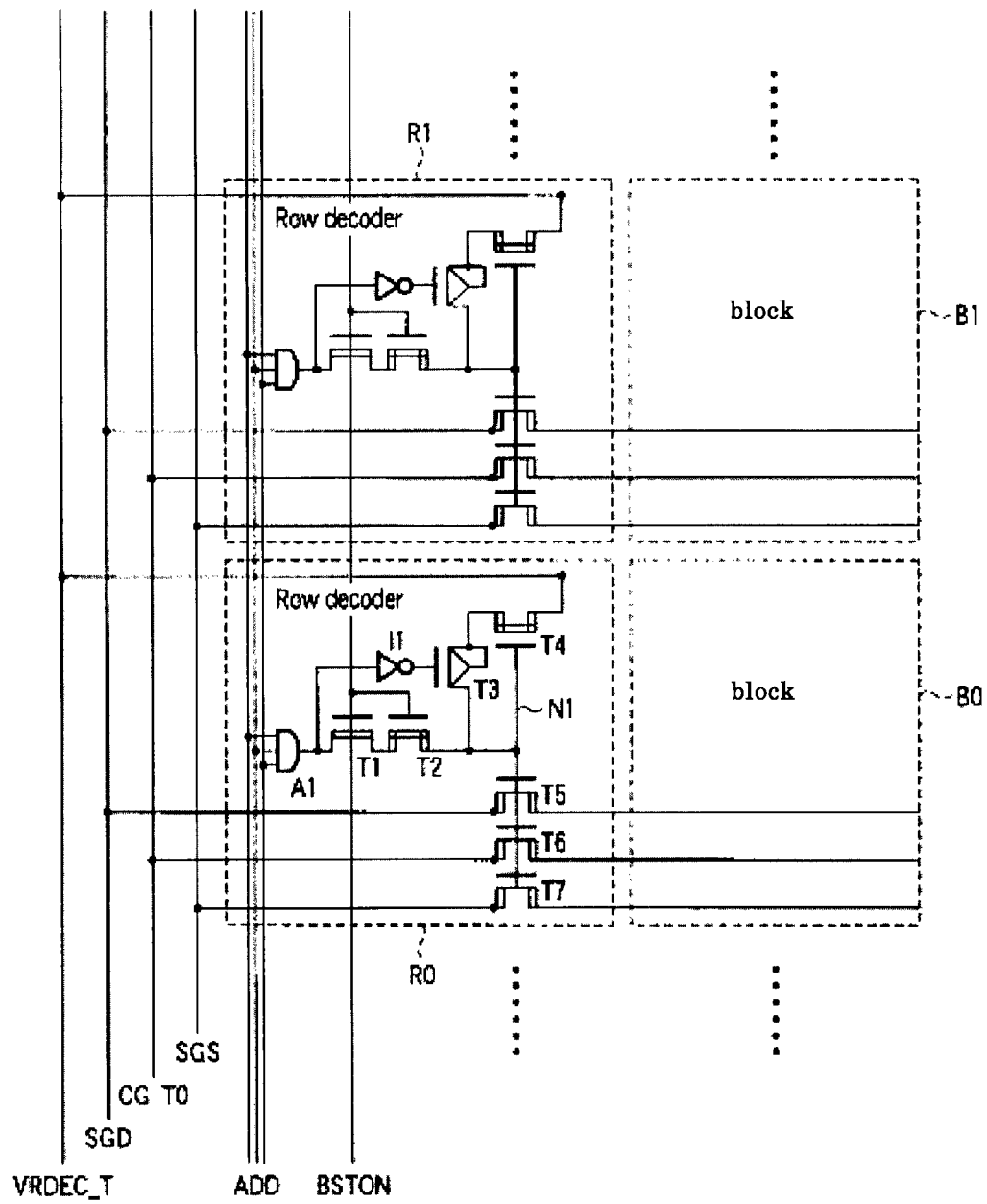
FIG. 3 is an enlarged diagram illustrating portion A shown in FIG. 2.

FIG. 3 is an enlarged diagram illustrating portion A of FIG. 2, and describing the details of the row decoders, the power lines, and the signal lines.

As FIG. 3 shows, blocks B0 and B1 are provided in the plane P0. A row decoder R0 is provided next to the block B0 and in a manner that the row-decoder R0 corresponds to the block B0. Likewise, a row decoder R1 is provided next to the block B1 and in a manner that the row decoder R1 corresponds to the block B1.

Each of the row decoders R0 and R1 includes: an AND circuit A1; transistors T1, T2, T3, T4, T5, T6, and T7; and an inverter I1. An address ADD is inputted into an input terminal of the AND circuit A1, and the output terminal of the AND circuit A1 is connected to the drain of the transistor T3 and the gates of the transistors T4 to T7 via the current paths of the transistors T1 and T2 and via a node N1. In addition, the output terminal of the AND circuit A1 is connected to the gate of the transistor TR3 via the inverter I1.

A power line VRDEC_T is connected to the source of the transistor T3 via the transistor T4. A signal line CG_T is connected to the word line in the block B0 via the transistor T6. A signal line SGD is connected to a selection transistor in the block B0 via the transistor T5, whereas a signal line SGS is connected to a selection transistor in the block B0 via the transistor T7. Furthermore, a boost-on signal BSTON is connected to the gates of the transistors T1 and T2.

In the write operation, each row decoder acts in the following way.

If the AND circuit A1 outputs an "H" on the basis of the address ADD and the boost-on signal BSTON turns on the transistors T1 and T2, a current flows from the power line VRDEC_T through the transistors T4 and T3 to the node N1, and the voltage of the node N1 is gradually raised up to the program high voltage VPGMH. Thus the transistors T5, T6, and T7 are turned on, and thus the voltage of the signal line CG_T0 is supplied to the memory cells in the block B0 while the voltages of the signal lines SGD and SGS are supplied to the selection transistors in the block B0. Thus, the write operation is performed for the memory cells in the block B0.

[1-4] Modified Examples of First Embodiment

Figure 4:
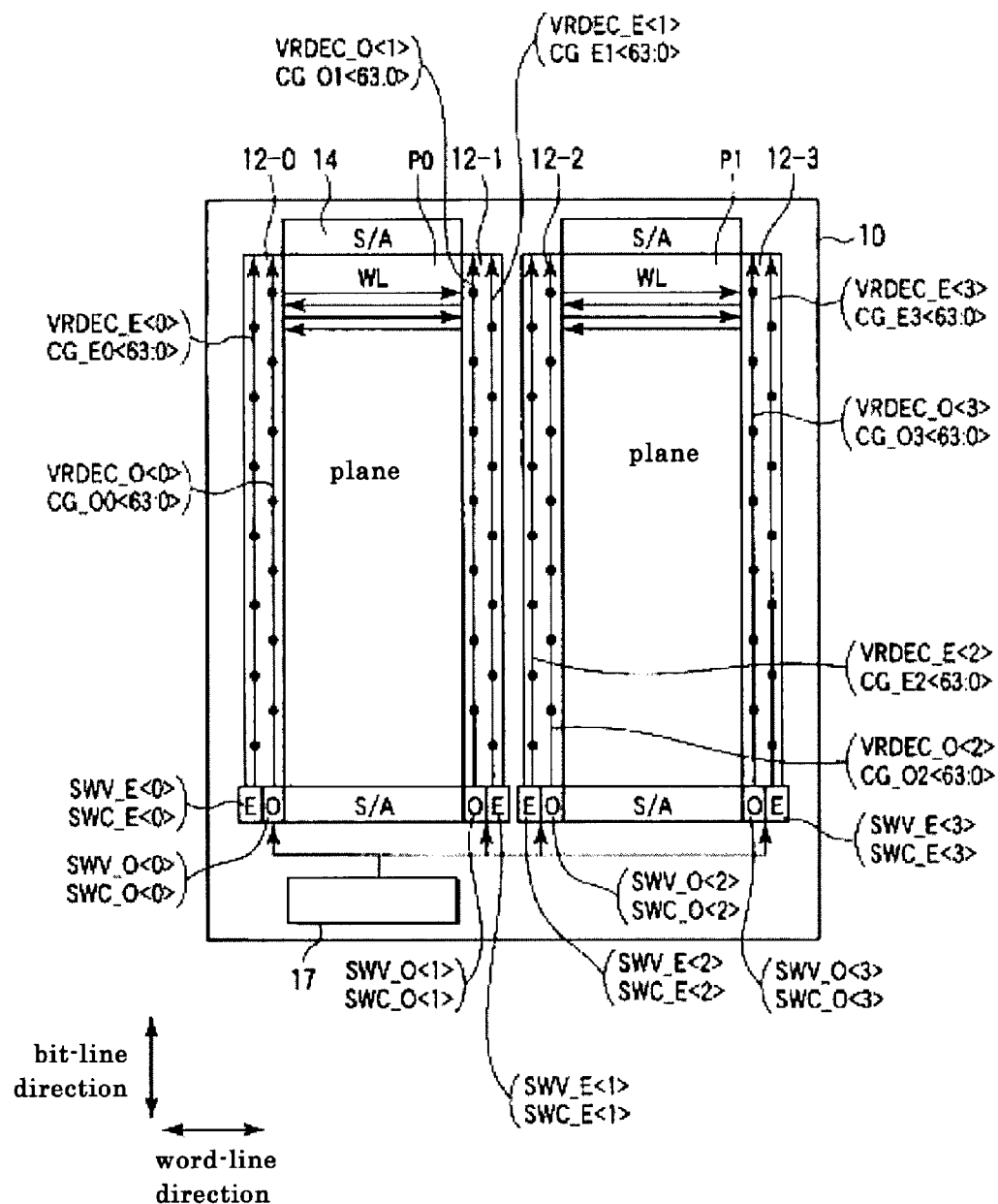
FIG. 4 is a schematic diagram illustrating a power line and a signal line connected to row decoders according to a modified example of the first embodiment.

FIG. 4 is a schematic diagram illustrating power lines and signal lines connected to row decoders according to a first modified example of the first embodiment.

In the case of FIG. 2 described above, the power lines VRDEC and the signal lines CG are divided into two categories in the bit-line direction. To put it differently, some of the power lines VRDEC and some of the signal lines CG are for the row-decoder groups on the top side, while the other power lines VRDEC and the other signal lines CG are for the row-decoder groups on the bottom side. In an alternative configuration such as one shown in FIG. 4, however, plural power lines and plural signal lines each of which extends in the bit-line direction may be provided in the word-line direction in a manner that the power lines and the signal lines are parallel to one another, and row decoders are connected alternately to those power lines and signal lines.

As FIG. 4 shows, a memory-cell array 11 includes plural planes. To be specific, two planes P0 are P1 are shown in FIG. 4. Each of the planes P0 and P1 includes plural blocks. Each block includes plural memory cells that are provided at the intersections of word lines WL and bit lines on a one-to-one basis in a matrix shape.

On a first end of the plane P0, plural row decoders 12-0 are provided one next to another. On the other hand, on a second end of the plane P0, plural row decoders 12-1 are provided one next to another. The row decoders 12-0 are provided corresponding to the blocks included in the plane P0 on a one-to-one basis. The row decoders 12-1 are also provided corresponding to the blocks included in the plane P0 on a one-to-one basis. Note that the row decoders 12-0 on the first-end side and the row decoders 12-1 on the second-end side are alternately connected to their corresponding blocks in the plane P0.

Likewise, on a first end of the plane P1, plural row decoders 12-2 are provided one next to another. On the other hand, on a second end of the plane P1, plural row decoders 12-3 are provided one next to another. The row decoders 12-2 are provided corresponding to the blocks included in the plane P1 on a one-to-one basis. The row decoders 12-3 are also provided corresponding to the blocks included in the plane P1 on a one-to-one basis. Note that the row decoders 12-2 on the first-end side and the row decoders 12-3 on the second-end side are alternately connected to their corresponding blocks in the plane P1.

A power line VRDEC_E<0> and a power line VRDEC_O<0> are provided on the first-end side of the plane P0. Of the plural row decoders 12-0, the power line VRDEC_E<0> is connected to a group of even-numbered row decoders. Of the plural row decoders 12-0, the power line VRDEC_O<0> is connected to a group of odd-numbered row decoders.

A row-system peripheral circuit 17 is provided near the planes P0 and P1. Both the power line VRDEC_E<0> and the power line VRDEC_O<0> are connected to the output terminal of the row-system peripheral circuit 17. A switching circuit SWV_E<0> is connected between the row-system peripheral circuit 17 and the power line VRDEC_E<0>. A switching circuit SWV_O<0> is connected between the row-system peripheral circuit 17 and the power line VRDEC_O<0>.

In addition, a power line VRDEC_E<1> and a power line VRDEC_O<1> are provided on the second-end side of the plane P0. Of the plural row decoders 12-1, the power line VRDEC_E<1> is connected to a group of even-numbered row decoders. Of the plural row decoders 12-1, the power line VRDEC_O<1> is connected to a group of odd-numbered row decoders.

Both the power line VRDEC_E<1> and the power line VRDEC_O<1> are connected to the output terminal of the row-system peripheral circuit 17. A switching circuit SWV_E<1> is connected between the row-system peripheral circuit 17 and the power line VRDEC_E<1>. A switching circuit SWV_O<1> is connected between the row-system peripheral circuit 17 and the power line VRDEC_O<1>.

In addition, a power line VRDEC_E<2> and a power line VRDEC_O<2> are provided on the first-end side of the plane P1. Of the plural row decoders 12-2, the power line VRDEC_E<2> is connected to a group of even-numbered row decoders. Of the plural row decoders 12-2, the power line VRDEC_O<2> is connected to a group of odd-numbered row decoders.

Both the power line VRDEC_E<2> and the power line VRDEC_O<2> are connected to the output terminal of the row-system peripheral circuit 17. A switching circuit SWV_E<2> is connected between the row-system peripheral circuit 17 and the power line VRDEC_E<2>. A switching circuit SWV_O<2> is connected between the row-system peripheral circuit 17 and the power line VRDEC_O<2>.

In addition, a power line VRDEC_E<3> and a power line VRDEC_O<3> are provided on the second-end side of the plane P1. Of the plural row decoders 12-3, the power line VRDEC_E<3> is connected to a group of even-numbered row decoders. Of the plural row decoders 12-3, the power line VRDEC_O<3> is connected to a group of odd-numbered row decoders.

Both the power line VRDEC_E<3> and the power line VRDEC_O<3> are connected to the output terminal of the row-system peripheral circuit 17. A switching circuit SWV_E<3> is connected between the row-system peripheral circuit 17 and the power line VRDEC_E<3>. A switching circuit SWV_O<3> is connected between the row-system peripheral circuit 17 and the power line VRDEC_O<3>.

Next, a description is given of signal lines CG configured to supply the program voltage to the word lines.

A signal line CG_E0<63:0> and a signal line CG_O0<63:0> are provided on the first-end side of the plane P0. In this first modified example, each block includes 64 word lines, and 64 signal lines are connected to those 64 word lines on a one-to-one basis. The signal line CG_E0<63:0> is connected to a group of the even-numbered row decoders among the plural row decoders 12-0, and the signal line CG_O0<63:0> is connected to a group of the odd-numbered row decoders among the plural row decoders 12-0.

The signal line CG_E0<63:0> and the signal line CG_O0<63:0> are connected to the output terminal of the row-system peripheral circuit 17. A switching circuit SWC_E<0> is connected between the row-system peripheral circuit 17 and the signal line CG_E0<63:0>. A switching circuit SWC_O<0> is connected between the row-system peripheral circuit 17 and the signal line CG_O0<63:0>.

Moreover, a signal line CG_E1<63:0> and a signal line CG_O1<63:0> are provided on the second-end side of the plane P0. The signal line CG_E1<63:0> is connected to a group of the even-numbered row decoders among the plural row decoders 12-1, and the signal line CG_O1<63:0> is connected to a group of the odd-numbered row decoders among the plural row decoders 12-1.

Both the signal line CG_E1<63:0> and the signal line CG_O1<63:0> are connected to the output terminal of the row-system peripheral circuit 17. A switching circuit SWC_E<1> is connected between the row-system peripheral circuit 17 and the signal line CG_E1<63:0>. A switching circuit SWC_O<1> is connected between the row-system peripheral circuit 17 and the signal line CG_O1<63:0>.

Further, a signal line CG_E2<63:0> and a signal line CG_O2<63:0> are provided on the first-end side of the plane P1. The signal line CG_E2<63:0> is connected to a group of the even-numbered row decoders among the plural row decoders 12-2, and the signal line CG_O2<63:0> is connected to a group of the odd-numbered row decoders among the plural row decoders 12-2.

The signal line CG_E2<63:0> and the signal line CG_O2<63:0> are connected to the output terminal of the row-system peripheral circuit 17. A switching circuit SWC_E<2> is connected between the row-system peripheral circuit 17 and the signal line CG_E2<63:0>. A switching circuit SWC_O<2> is connected between the row-system peripheral circuit 17 and the signal line CG_O2<63:0>.

Furthermore, a signal line CG_E3<63:0> and a signal line CG_O3<63:0> are provided on the second-end side of the plane P1. The signal line CG_E3<63:0> is connected to a group of the even-numbered row decoders among the plural row decoders 12-3, and the signal line CG_O3<63:0> is connected to a group of the odd-numbered row decoders among the plural row decoders 12-3.

The signal line CG_E3<63:0> and the signal line CG_O3<63:0> are connected to the output terminal of the row-system peripheral circuit 17. A switching circuit SWC_E<3> is connected between the row-system peripheral circuit 17 and the signal line CG_E3<63:0>. A switching circuit SWC_O<3> is connected between the row-system peripheral circuit 17 and the signal line CG_O3<63:0>.

Other configurations and actions of this first modified example are the same as the ones of the first embodiment shown in FIG. 2.

Figure 5:
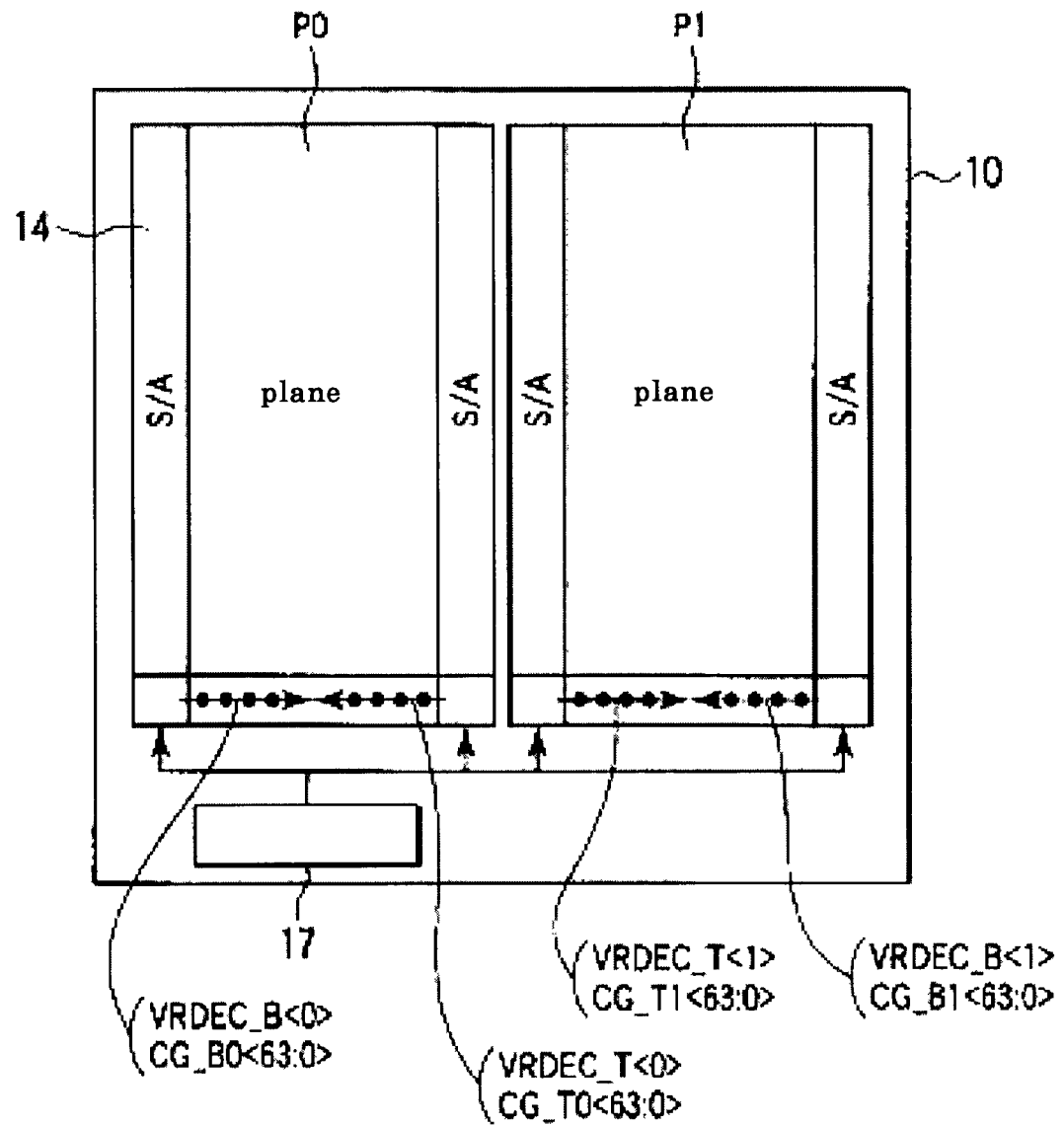
FIG. 5 is a schematic diagram illustrating a power line and a signal line connected to row decoders according to another modified example of the first embodiment.

FIG. 5 is a schematic diagram illustrating a power line and a signal line connected to row decoders according to another modified example of the first embodiment.

In the case of FIG. 2 described above, the row decoders are provided on a first end and on a second end, in the word-line direction, of each of the planes P0 and P1 (i.e. on the left end and on the right end of each of the planes P0 and P1), and the sense amplifiers are provided on a first end and on a second end, in the bit-line direction, of each of the planes P0 and P1 (i.e. on the top end and on the bottom end of each of the planes P0 and P1). In an alternative configuration such as one shown in FIG. 4, however, the row-decoder may be provided on the bottom end of each of the planes P0 and P1, and the sense amplifiers may be provided on the left end and on the right end of each of the planes P0 and P1. Other configurations of this second modified example are the same as those of the first embodiment shown in FIG. 2.

[1-5] Effects of First Embodiment

In the first embodiment, the power line VRDEC and the signal line CG that are provided at the first-end side of each memory-cell array and that are connected to the plural row decoders are divided into plural members. To put it differently, plural power lines VRDEC and plural signal lines CG are provided on the first-end side of each memory-cell array. Of the plural power lines VRDEC and the plural signal lines CG, the power lines VRDEC and the signal line CG that are connected to the row-decoder group not including row decoder corresponding to the selected block are made floating.

Accordingly, a reduction can be achieved in the load capacity for each pump that supplies a voltage to the corresponding power line VRDEC or the corresponding signal line CG. Consequently, a reduction can be achieved in the area of each pump circuit that supplies a voltage to the corresponding power line VRDEC or the corresponding signal line CG. Note that the load capacity refers to a junction capacity of a circuit (transistor) in the non-selected state connected mainly either to the power line VRDEC or the signal line CG.

In addition, by providing the plural power lines VRDEC and the plural signal lines CG, a reduction can be achieved in the number of the row decoders and that of the blocks to be connected to each individual power line VRDEC or to each individual signal line CG. Accordingly, a reduction can be achieved in the stress on each switching circuit (driver) that supplies a voltage to the corresponding power line VRDEC or to the corresponding signal line CG. Moreover, a reduction can be achieved in the stress on each column-selection switch (row-decoder-block switch).

According to the first embodiment, a nonvolatile semiconductor memory device can be provided which achieves a reduction both in the area of each of the pump circuits serving as the voltage supply sources to the power lines and the like, and in the stress on each of the switching circuits transferring voltages to the power lines and the like.

[2] Second Embodiment

Next, a description is given of a NAND flash memory according to a second embodiment.

In the configuration of the first embodiment described above, the power line and the signal line provided on the first-end side of each memory-cell array are divided into plural members, and the power line and the signal line connected to the row-decoder group corresponding to the non-selected block are disconnected from the power-supply circuit. Besides the configuration of the first embodiment, the second embodiment includes a configuration for the reuse of the electrical charges accumulated in the power lines and the signal lines (charge recycling). The operation of the charge recycling is controlled by a control circuit 15. Note that the NAND flash memory of this second embodiment has the same overall configuration as that of the first embodiment, so no detailed description of the NAND flash memory is given below.

Figure 6:
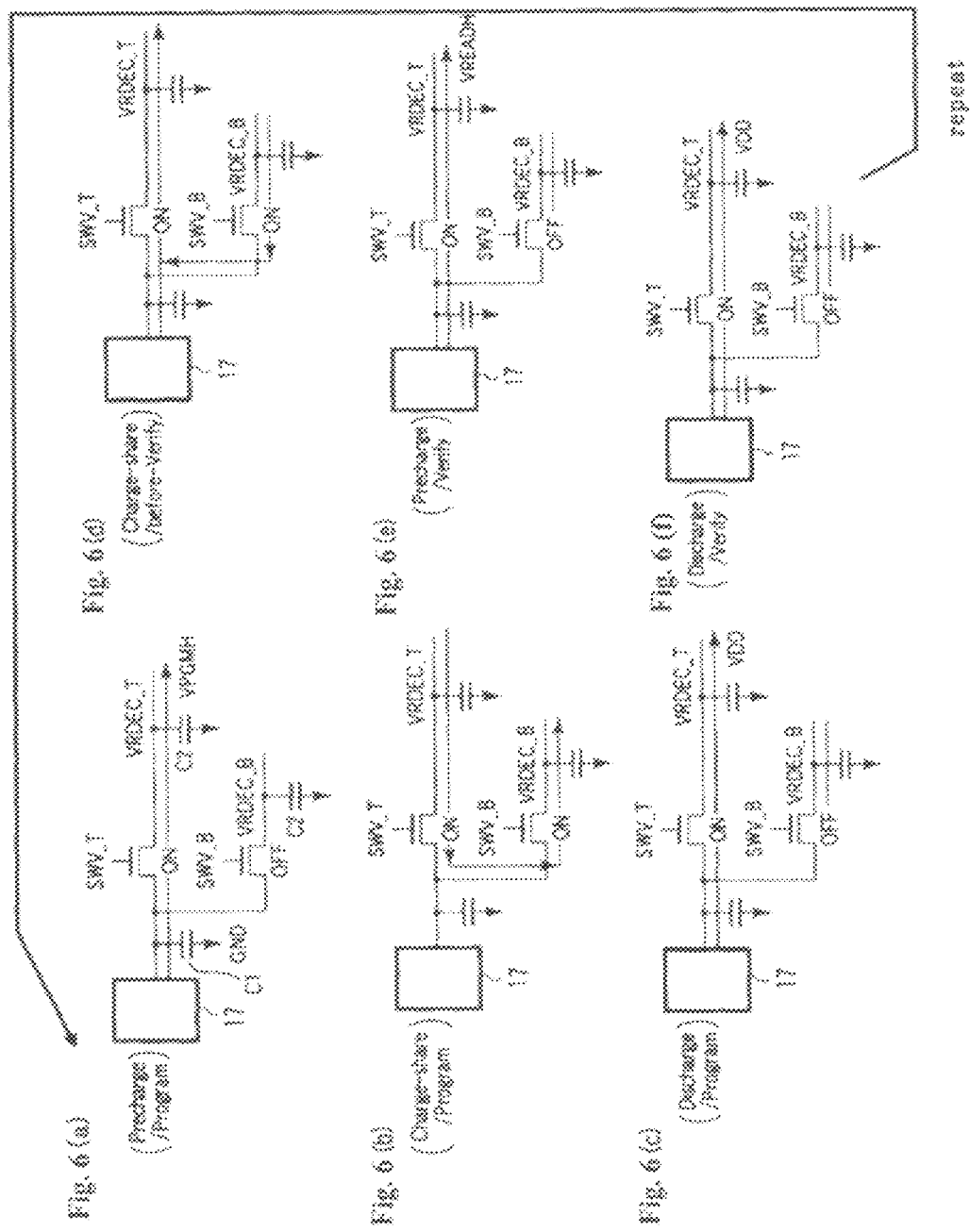
FIGS. 6A to 6F are diagrams illustrating the charging and the discharging of power lines VRDEC_T and VRDEC_B according to a second embodiment.

[2-1] Charge Recycling of Power Lines VRDEC (1) Charge Recycling During Transition from Write Operation to Write-Verify Operation FIGS. 6A to 6F are diagrams illustrating the charging and the discharging of the two divided power lines VRDEC_T and VRDEC_B. FIGS. 6A to 6C illustrate the charging and the discharging in the write operation. FIGS. 6D to 6F illustrate the charging and the discharging in the write-verify operation that follows the write operation.

In FIGS. 6A to 6F, a row-system peripheral circuit 17 includes drivers that supply a program high voltage VPGMH and a read high voltage VREADH to a power line VRDEC_T and a power line VRDEC_B. Both the power line VRDEC_T and the power line VRDEC_Bare connected to the row-system peripheral circuit 17. A switching circuit SWV_T is provided between the row-system peripheral circuit 17 and the power line VRDEC_T. A switching circuit SWV_B is provided between the row-system peripheral circuit 17 and the power line VRDEC_B.

Here, the power line VRDEC_T is connected to a row-decoder group corresponding to selected block while the power line VRDEC_B is connected to a row-decoder group corresponding to a non-selected block. Note that a capacity C1 represents the wiring capacity between the row-system peripheral circuit 17 and the switching circuits SWV_T, SWV_B. In addition, a capacity C2 represents the total capacity of the junction capacity of the circuit portion located at the row-decoder side of the switching circuit SWV_T and the wiring capacity of the power line VRDEC_T. The capacity C2 also represents the total capacity of the junction capacity of the circuit portion located at the row-decoder side of the switching circuit SWV_B and the wiring capacity of the power line VRDEC_B.

The charge recycling in transition from the write operation to the write-verify operation is summarized as follows.

At the time of the transition from the write operation to the write-verify operation, the electrical charges accumulated in the power line VRDEC_T (a program high voltage VPGMH) connected to the row-decoder group corresponding to the selected block are temporarily moved to the power line VRDEC_B connected to the row-decoder group corresponding to the non-selected block. Then, at the start of the write-verify operation, the electrical charges temporarily accumulated in the power line VRDEC_B are moved back to the power line VRDEC_T. Subsequently, the power line VRDEC_T is charged up to the read high voltage VREADH, which is a voltage higher than the read voltage VREAD, and the write-verify operation is carried out with the read high voltage VREADH.

In this way, the electrical charges accumulated in the power line VRDEC_T during the write operation are temporarily moved to the power line VRDEC_B when the write operation is finished. Then, at the start of the write-verify operation, the electrical charges that have been moved to the power line VRDEC_B are moved back to the power line VRDEC_T, where the charges are used to charge the power line VRDEC_T.

Next, a description is given of the details of the above-described charge recycling.

Figure 7:
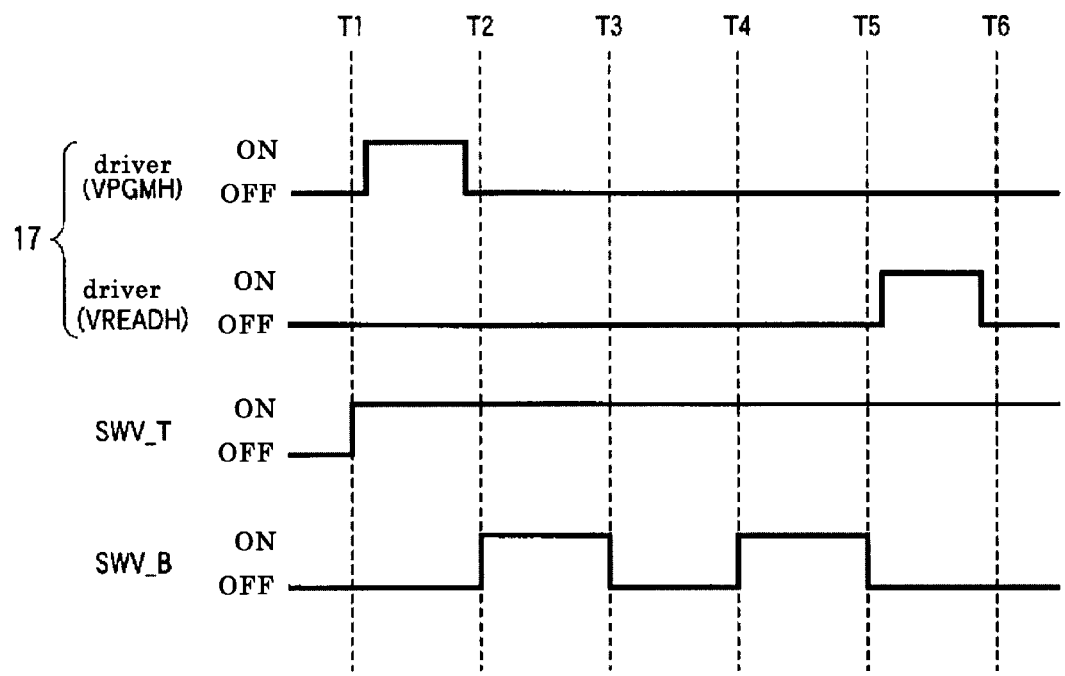
FIG. 7 is a timing chart illustrating a charge recycling in transition from a write operation to a write-verify operation according to the second embodiment.

FIG. 7 is a timing chart illustrating a charge recycling in transition from a write operation to a write-verify operation.

During the pre-charging in the write operation, the switching circuit SWV_T is turned on and the switching circuit SWV_B is turned off as shown at time T1 in FIG. 7. Then, electrical charges are supplied from the row-system peripheral circuit 17 to the power line VRDEC_T, and thereby the voltage of the power line VRDEC_T is raised up to the program high voltage VPGMH (see FIG. 6A). Thus, the write operation is carried out.

Then, after the write operation is finished, the switching circuit SWV_B is turned on with the switching circuit SWV_T kept in the on-state, as shown at time T2 in FIG. 7, before the electrical charges accumulated in the power line VRDEC_T are discharged. Thus, the electrical charges accumulated in the power line VRDEC_T are moved to the power line VRDEC_B. At this moment, the voltage of the power line VRDEC_T and the voltage of the power line VRDEC_B are equalized to each other, and both have a value of VPGMH×(C1+C2)/(C1+2×C2). See FIG. 6B (charge share).

Then, in the discharging carried out after the write operation is finished, the switching circuit SWV_B is turned off with the switching circuit SWV_T kept in the on-state, as shown at time T3 in FIG. 7. Thus, the electrical charges in the power line VRDEC_T are discharged, and the voltage of the power line VRDEC_T becomes equal to a voltage VDD (see FIG. 6C).

Then, in the write-verify operation after the write operation is finished, the switching circuit SWV_B is turned on with the switching circuit SWV_T kept in the on-state, as shown at time T4 in FIG. 7, before the pre-charging for the read operation is carried out. Thus, the electrical charges accumulated in the power line VRDEC_B are moved back to the power line VRDEC_T. At this moment, the voltage of the power line VRDEC_T and the voltage of the power line VRDEC_B are equalized to each other, and have a value of VPGMH×(C1+C2)/(C1+2×C2)×C2/(C1+2×C2). See FIG. 6D (charge share).

Then, in the pre-charging for the write-verify operation, the switching circuit SWV_B is turned off with the switching circuit SWV_T kept in the on-state, as shown at time T5 in FIG. 7. Then, electrical charges are supplied from the row-system peripheral circuit 17 to the power line VRDEC_T, and thereby the voltage of the power line VRDEC_T is raised up to a read high voltage VREADH. Thus the write-verify operation, that is, the read operation is carried out (see FIG. 6E).

Then, in the discharging carried out after the write-verify operation is finished, the electrical charges in the power line VRDEC_T are discharged with the switching circuit SWV_T kept in the on-state and the switching circuit SWV_B kept in the off-state, as shown at time T6 in FIG. 7. Then, the voltage of the power line VRDEC_T becomes equal to the voltage VDD (see FIG. 6F).

If another write operation is carried out later, the operation is started again from the action shown in FIG. 6A, and the actions shown in FIG. 6A to FIG. 6F are repeated.

In the case shown in FIGS. 6A to 6F, the electrical charges having been moved from the power line VRDEC_T to the power line VRDEC_B after the pre-charging for the write operation are moved back from the power line VRDEC_B to the power line VRDEC_T before the pre-charging for the write-verify operation. Thus, in the pre-charging for the write-verify operation, a reduction can be achieved in the amount of electrical charges supplied from the row-system peripheral circuit 17. To put it simply, a reduction can be achieved in the electric-current consumption.

Figure 8:
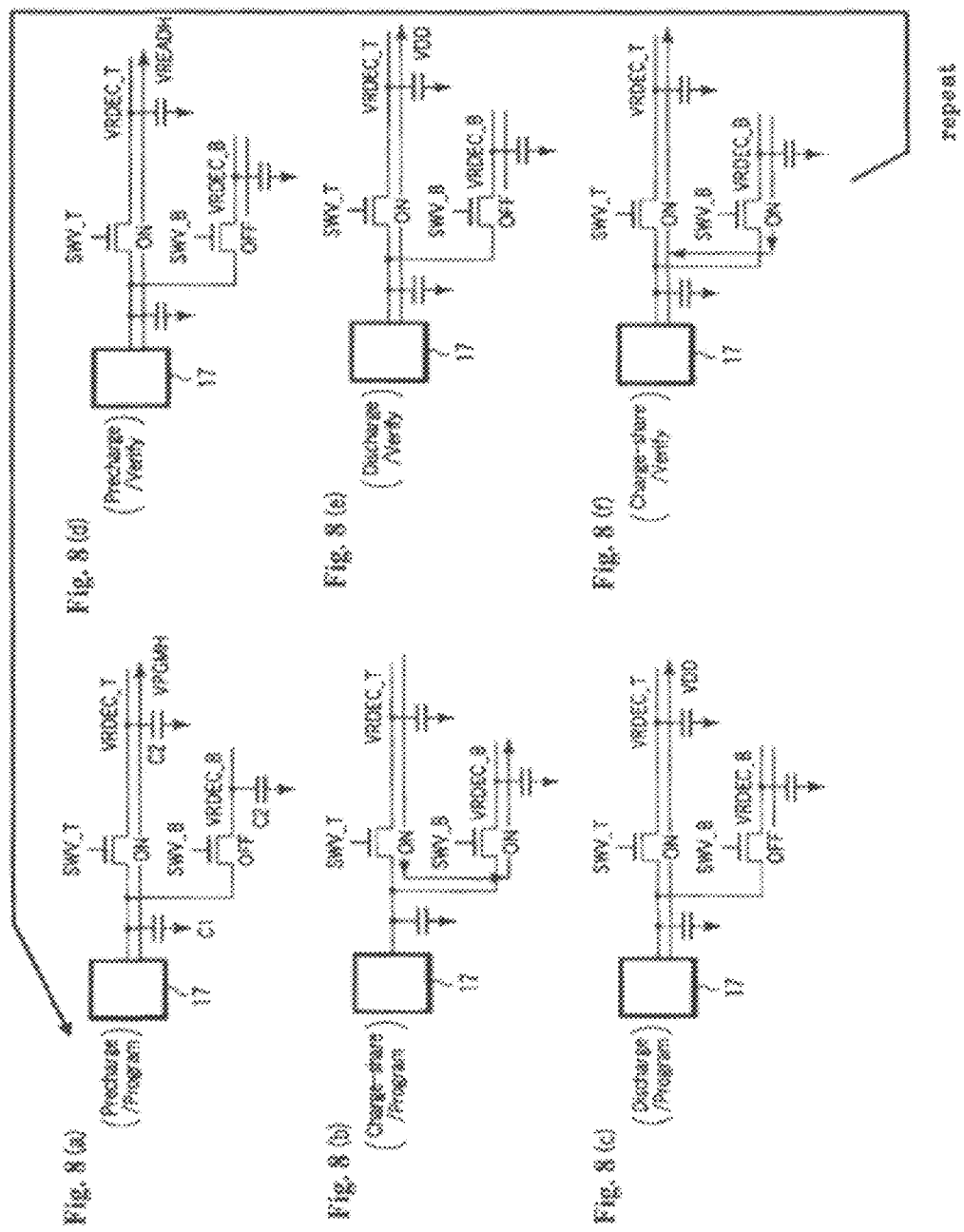
FIGS. 8A to 8F are diagrams illustrating the charging and the discharging of power lines VRDEC_T and VRDEC_B according to the second embodiment.
Figure 9:
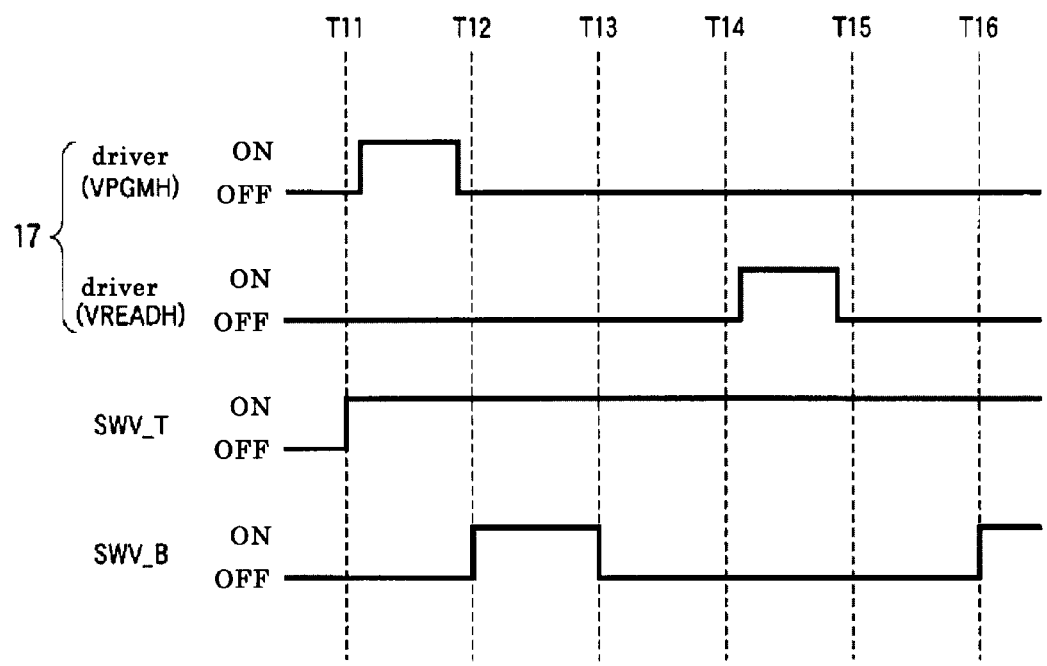
FIG. 9 is a timing chart illustrating a charge recycling in transition from a write operation to the next write operation according to the second embodiment.

(2) Charge Recycling During Transition from Write Operation to Next Write Operation FIGS. 8A to 8F are diagrams illustrating the charging and the discharging of the two divided power lines VRDEC_T and VRDEC_B. FIGS. 8A to 8C illustrate the charging and the discharging in the write operation. FIGS. 8D to 8F illustrate the charging and the discharging in the write-verify operation that follows the write operation. FIG. 9 is a timing chart illustrating a charge recycling in transition from a write operation to the next write operation.

The actions in the write operation shown in FIGS. 8A to 8C (i.e. the period from time T11 to time T13 in FIG. 9) are the same as those shown in FIGS. 6A to 6C (i.e. the period from time T1 to time T3 in FIG. 7).

Then, the pre-charging for a read operation is carried out in the write-verify operation which is carried out after the write operation is finished and which continues from the state shown in FIG. 8C. As shown at time T14 in FIG. 9, electrical charges are supplied from the row-system peripheral circuit 17 to the power line VRDEC_T with the switching circuit SWV_T kept in the on-state and the switching circuit SWV_B kept in the off-state, and thereby the voltage of the power line VRDEC_T is raised up to the read high voltage VREADH. Thus, the write-verify operation, i.e. the read operation, is carried out (see FIG. 8D).

Then, in the discharging carried out after the write-verify operation is finished, the electrical charges in the power line VRDEC_T are discharged with the switching circuit SWV_T kept in the on-state and the switching circuit SWV_B kept in the off-state, as shown at time T15 in FIG. 9, and thereby the voltage of the power line VRDEC_T becomes equal to the voltage VDD (see FIG. 8E).

Then, before the pre-charging for the next write operation is carried out, the switching circuit SWV_B is turned on with the switching circuit SWV_T kept in the on-state, as shown at time T16 in FIG. 9. Thus, the electrical charges accumulated in the power line VRDEC_B are moved to the power line VRDEC_T. At this moment, the voltage of the power line VRDEC_T and the voltage of the power line VRDEC_B are equalized to each other, and have a value of VPGMH×(C1+C2)/(C1+2×C2)×C2/(C1+2×C2). See FIG. 8F (charge share).

Subsequently, during the pre-charging in the next write operation, the switching circuit SWV_T is turned on and the switching circuit SWV_B is turned off as shown at time T11 in FIG. 9. Then, electrical charges are supplied from the row-system peripheral circuit 17 to the power line VRDEC_T, and thereby the voltage of the power line VRDEC_T is raised up to the program high voltage VPGMH (see FIG. 6A). Thus, the write operation is carried out (see FIG. 8A). Thereafter, the actions shown in FIG. 8B to FIG. 8F are repeated.

In the case shown in FIGS. 8A to 8F, the electrical charges having been moved from the power line VRDEC_T to the power line VRDEC_B after the pre-charging for the write operation are moved back from the power line VRDEC_B to the power line VRDEC_T before the pre-charging for the next write operation. Thus, in the pre-charging for the next write operation, a reduction can be achieved in the amount of electrical charges supplied from the row-system peripheral circuit 17. To put it simply, a reduction can be achieved in the electric-current consumption.

Figure 10:
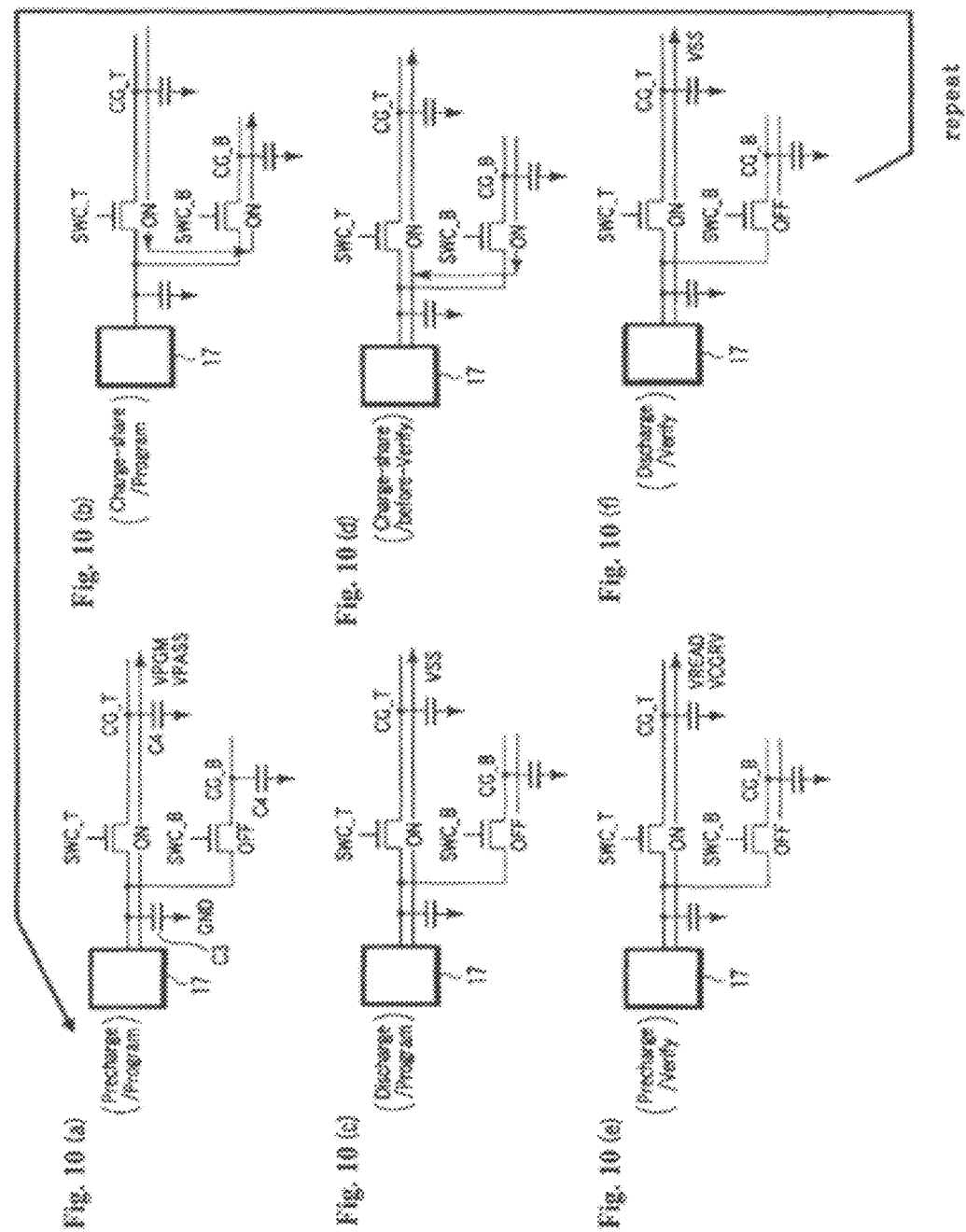
FIGS. 10A to 10F are diagrams illustrating the charging and the discharging of signal lines CG_T and CG_B according to the second embodiment.

[2-2] Charge Recycling of Signal Lines CG (1) Charge Recycling During Transition from Write Operation to Next Write Operation FIGS. 10A to 10F are diagrams illustrating the charging and the discharging of the two divided signal lines CG_T and signal lines CG_B. FIGS. 10A to 10C illustrate the charging and the discharging in the write operation. FIGS. 10D to 10F illustrate the charging and the discharging in the write-verify operation that follows the write operation.

In FIGS. 10A to 10F, a row-system peripheral circuit 17 includes drivers that supply a program voltage VPGM, an intermediate voltage VPASS, a read voltage VREAD and an intermediate voltage VCGRV to the signal lines CG_T and the signal lines CG_B. Both the signal lines CG_T and the signal lines CG_B are connected to the row-system peripheral circuit 17. A switching circuit SWC_T is provided between the row-system peripheral circuit 17 and the signal line CG_T. A switching circuit SWC_B is provided between the row-system peripheral circuit 17 and the signal line CG_B.

Here, the signal line CG_T is connected to a row-decoder group corresponding to selected block while the signal line CG_B is connected to a row-decoder group corresponding to a non-selected block. Note that a capacity C3 represents the wiring capacity between the row-system peripheral circuit 17 and the switching circuits SWC_T, SWC_B. In addition, a capacity C4 represents the total capacity of the junction capacity of the circuit portion located at the row-decoder side of the switching circuit SWC_T and the wiring capacity of the signal line CG_T. The capacity C4 also represents the total capacity of the junction capacity of the circuit portion located at the row-decoder side of the switching circuit SWC_B and the wiring capacity of the signal line CG_B.

Details of the charge recycling are described below.

Figure 11:
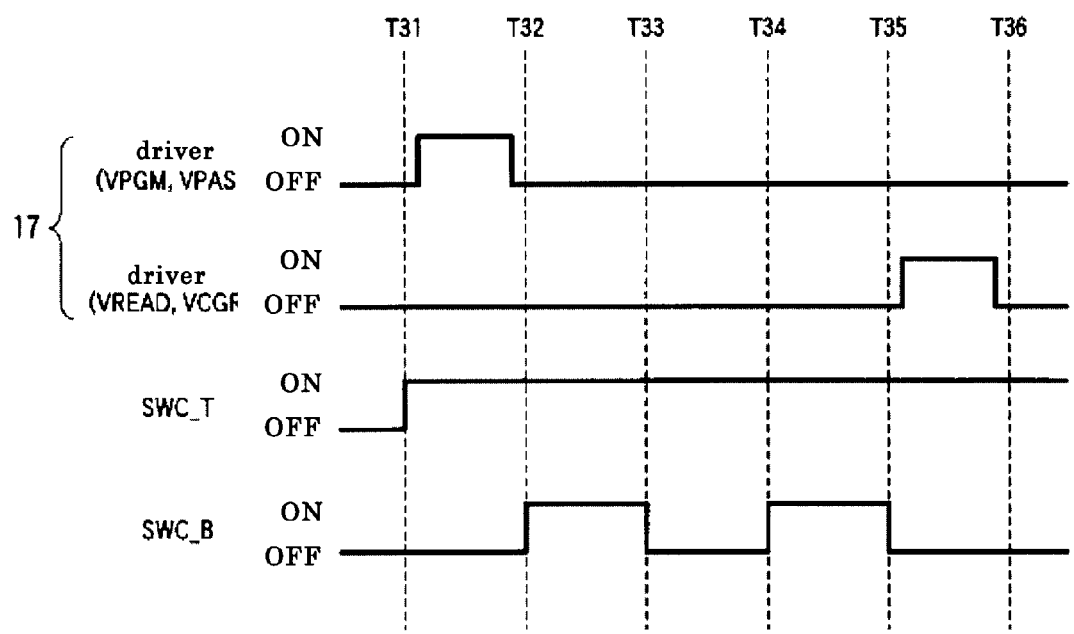
FIG. 11 is a timing chart illustrating a charge recycling in transition from a write operation to a write-verify operation according to the second embodiment.

FIG. 11 is a timing chart illustrating a charge recycling in transition from a write operation to a write-verify operation according to the second embodiment.

During the pre-charging in the write operation, the switching circuit SWC_T is turned on and the switching circuit SWC_B is turned off as shown at time T31 in FIG. 11. Then, electrical charges are supplied from the row-system peripheral circuit 17 to the signal line CG_T, and thereby the voltage of the signal line CG_T is raised up to the program voltage VPGM or the intermediate voltage VPASS (see FIG. 10A). Then, the program voltage VPGM is supplied to selected word lines while the intermediate voltage VPASS is supplied to non-selected word lines. Thus, the write operation is carried out.

Then, after the write operation is finished, the switching circuit SWC_B is turned on with the switching circuit SWC_T kept in the on-state, as shown at time T32 in FIG. 11, before the electrical charges accumulated in the signal line CG_T are discharged. Thus, the electrical charges accumulated in the signal line CG_T are moved to the signal line CG_B. At this moment, the voltage of the signal line CG_T and the voltage of the signal line CG_B are equalized to each other. See FIG. 10B (charge share).

Then, in the discharging carried out after the write operation is finished, the switching circuit SWC_B is turned off with the switching circuit SWC_T kept in the on-state, as shown at time T33 in FIG. 11. Thus, the electrical charges in the signal line CG_T are discharged, and the voltage of the signal line CG_T becomes equal to a reference voltage (ground potential, for example) Vss. See FIG. 10C.

Then, in the write-verify operation after the write operation is finished, the switching circuit SWC_B is turned on with the switching circuit SWC_T kept in the on-state, as shown at time T34 in FIG. 11, before the pre-charging for the read operation is carried out. Thus, the electrical charges accumulated in the signal line CG_B are moved back to the signal line CG_T. At this moment, the voltage of the signal line CG_T and the voltage of the signal line CG_B are equalized to each other. See FIG. 10D (charge share).

Then, in the pre-charging for the write-verify operation, the switching circuit SWC_B is turned off with the switching circuit SWC_T kept in the on-state, as shown at time T35 in FIG. 11. Then, electrical charges are supplied from the row-system peripheral circuit 17 to the signal line CG_T, and thereby the voltage of the signal line CG_T is raised up to the read voltage VREAD or the intermediate voltage VCGRV. Then, the read voltage VREAD is supplied to the selected word lines while the intermediate voltage VCGRV is supplied to the non-selected word lines. Thus the write-verify operation, that is, the read operation is carried out (see FIG. 10E).

Then, in the discharging carried out after the write-verify operation is finished, the electrical charges in the signal line CG_T are discharged with the switching circuit SWC_T kept in the on-state and the switching circuit SWC_B kept in the off-state, as shown at time T36 in FIG. 11. Then, the voltage of the signal line CG_T becomes equal to the reference voltage Vss (see FIG. 10F).

If another write operation is carried out later, the operation is started again from the action shown in FIG. 10A, and the actions shown in FIG. 10A to FIG. 10F are repeated.

In the case shown in FIGS. 10A to 10F, the electrical charges having been moved from the signal line CG_T to the signal line CG_B after the pre-charging for the write operation are moved back from the signal line CG_B to the signal line CG_T before the pre-charging for the write-verify operation. Thus, in the pre-charging for the write-verify operation, a reduction can be achieved in the amount of electrical charges supplied from the row-system peripheral circuit 17. To put it simply, a reduction can be achieved in the electric-current consumption.

(2) Charge Recycling During Transition from Write Operation to Next Write Operation In the case of transition from the write operation to the next write operation as well, the electrical charges having been moved from the signal line CG_T to the signal line CG_B after the pre-charging for the write operation are moved back from the signal line CG_B to the signal line CG_T before the pre-charging for the next write operation. Thus, in the pre-charging for the next write operation, a reduction can be achieved in the amount of electrical charges supplied from the row-system peripheral circuit 17. To put it simply, a reduction can be achieved in the electric-current consumption.

[2-3] Effects of Second Embodiment

In the second embodiment, the electrical charges accumulated in the power lines and the signal lines corresponding to the selected block in the write operation are temporarily moved to the power lines and the signal lines corresponding to the non-selected block after the write operation is finished. Then, at the start of the write-verify operation, the electrical charges moved to the power lines and the signal lines corresponding to the non-selected block are moved back to the power lines and the signal lines corresponding to the selected block, and are thereby used to charge these power lines and the signal lines.

Accordingly, in the pre-charging for the write-verify operation after the write operation, a reduction can be achieved in the amount of electric charges supplied from the power-supply circuit (pump). Consequently, a reduction can be achieved in the electric-current consumption.

In addition, the electrical charges accumulated in the power lines and the signal lines corresponding to the selected block in the write operation are temporarily moved to the power lines and the signal lines corresponding to the non-selected block after the write operation is finished. Then, at the start of the next write operation, the electrical charges moved to the power lines and the signal lines corresponding to the non-selected block are moved back to the power lines and the signal lines corresponding to the selected block, and are thereby used to charge these power lines and signal lines.

Accordingly, in the pre-charging for the next write operation after a write operation, a reduction can be achieved in the amount of electric charges supplied from the power-supply circuit (pump circuit). Consequently, a reduction can be achieved in the electric-current consumption.

Other effects of the second embodiment are the same as those of the first embodiment.

[3] Row-System Peripheral Circuit of Embodiments

Next, a description is given of the circuit configuration of the row-system peripheral circuit in the first and the second embodiments. The row-system peripheral circuit 17 includes pumps of various kinds, power-line/signal-line drivers, and local drivers for these.

[3-1] VPP Pump/VPASS Pump

A VPP pump generates the program voltage VPGM and the program high voltage VPGMH. A VPASS pump generates intermediate voltages VUSEL and VUSELL. The intermediate voltages VUSEL and VUSELL are supplied to the non-selected word lines in the selected block.

Figure 12:
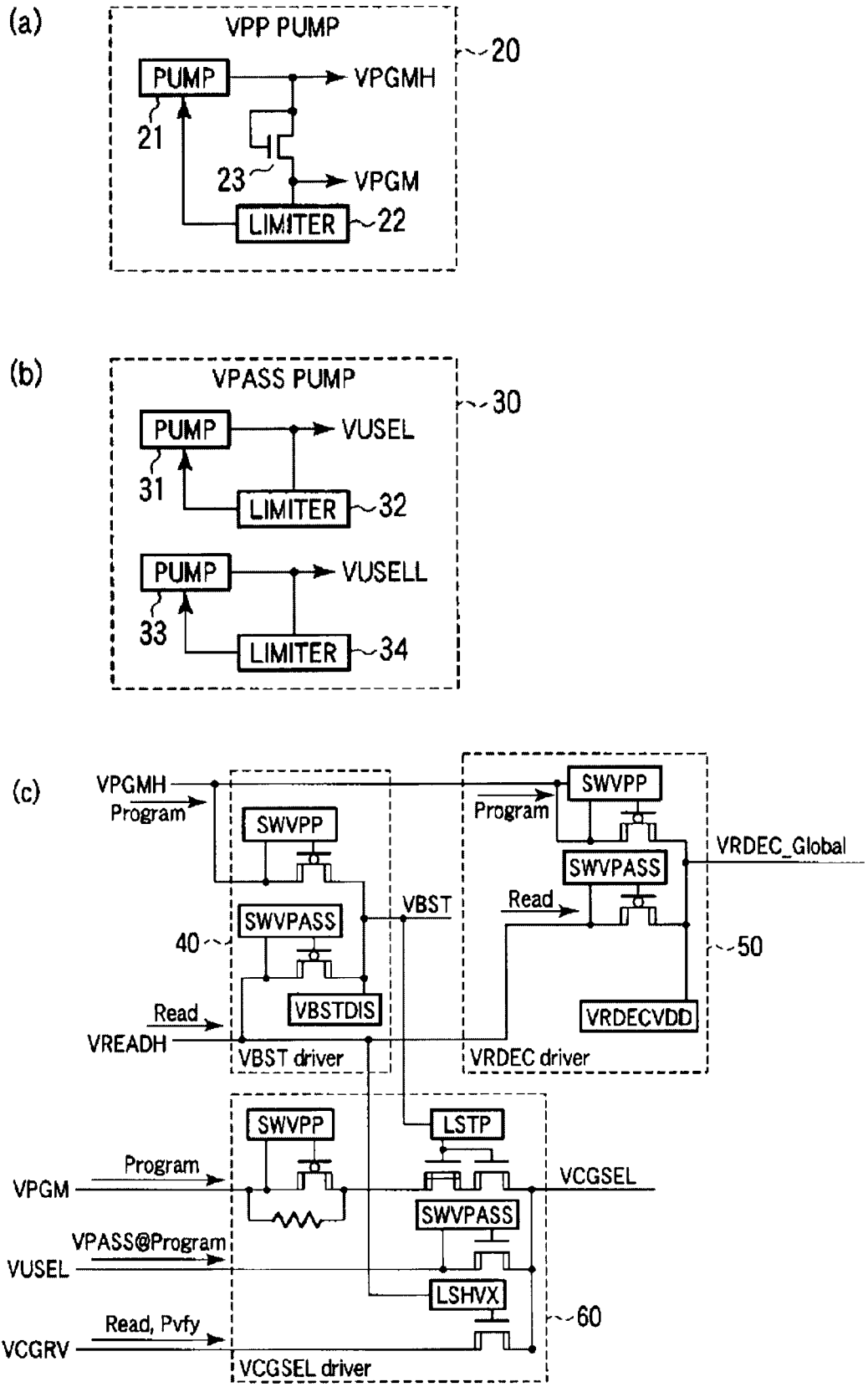
FIGS. 12A to 12C show circuit diagrams illustrating the configurations of a pump and a driver according to the first and the second embodiments.

FIG. 12A is a diagram illustrating the configuration of the VPP pump that generates the program voltage VPGM and the program high voltage VPGMH.

As FIG. 12A shows, a VPP pump 20 includes a pump 21, a limiter 22, and a transistor 23. In the VPP pump 20, the pump 21 supplies an electric current, and thereby the program high voltage VPGMH is generated. The transistor 23 is connected to the wiring for the program high voltage VPGMH, and the program voltage VPGM, which is a voltage lower than the program high voltage VPGMH by an amount equal to the threshold voltage of the transistor 23, is generated from the source of the transistor 23. In addition, the limiter 22 monitors the program voltage VPGM, and controls the turning on/off of the pump 21 so that the program voltage VPGM can be a predetermined voltage. Thus, the VPP pump 20 generates the program high voltage VPGMH and the program voltage VPGM.

FIG. 12B is a diagram illustrating the configuration of the VPASS pump that generates the intermediate voltages VUSEL and VUSELL.

As FIG. 12B shows, a VPP pump 30 includes pumps 31, 33, and limiters 32, 34. In the VPP pump 30, the pump 31 supplies an electric current, and thereby the intermediate voltage VUSEL is generated. In addition, the limiter 32 monitors the intermediate voltage VUSEL, and controls the turning on/off of the pump 31 so that the intermediate voltage VUSEL can be a predetermined voltage.

In addition, the pump 33 supplies an electric current, and thereby the intermediate voltage VUSELL is generated. In addition, the limiter 34 monitors the intermediate voltage VUSELL, and controls the turning on/off of the pump 33 so that the intermediate voltage VUSELL can be a predetermined voltage. Thus, the VPASS pump 30 generates the intermediate voltage VUSEL and the intermediate voltage VUSELL.

[3-2] Power Line/Signal Line Drivers

FIG. 12C is a diagram illustrating the configurations of various kinds of drivers that transfer voltages of various kinds to the power lines VRDEC and the signal lines CG.

The circuit illustrated in FIG. 12C includes a driver 40 that transfers a voltage VBST, a driver 50 that transfers a voltage VRDEC_Global to the power line VRDEC, and a driver 60 that transfers a voltage VCGSEL.

The driver 40 receives the input of the program high voltage VPGMH and that of the read high voltage VREADH. A switching circuit SWVPP and a switching circuit SWVPASS are provided to select either the program high voltage VPGMH or the read high voltage VREADH, and the selected one is outputted as the voltage VBST.

The driver 50 receives the input of the program high voltage VPGMH and that of the read high voltage VREADH. A switching circuit SWVPP and a switching circuit SWVPASS are provided to select either the program high voltage VPGMH or the read high voltage VREADH, and the selected one is outputted as the voltage VRDEC_Global.

The driver 60 receives the input of program voltage VPGM, that of the intermediate voltage VUSEL, that of the intermediate voltage VCGRV, that of the voltage VBST, and that of the read high voltage VREADH. A switching circuit SWVPP, a switching circuit SWVPASS, a switching circuit LSTP, and a switching circuit LSHVX are provided to select one of the voltages VPGM, VUSEL, and VCGRV. Then, the selected one is outputted as the voltage VCGSEL.

FIG. 13A illustrates the configuration of a driver that transfers a voltage to the signal lines CG. FIG. 13B illustrates the configuration of a driver that transfers a voltage to a selection line SGD. FIG. 13C illustrates the configuration of a driver that transfers a voltage to a selection line SGS.

As FIG. 13A illustrates, a CG driver 70 receives the input of the read high voltage VREADH, that of the voltage VBST, that of the voltage VCGSEL, that of the intermediate voltage VUSEL, that of the intermediate voltage VUSELL, that of the voltage VGP, and that of the voltage VISO. In addition, a switching circuit LSTP, a switching circuit SWVPASS, and a switching circuit LSHVX are provided to select one of the inputted voltages. Then, the selected one is outputted as a voltage CG_Global.

As FIG. 13B illustrates, a CG driver 80 receives the input of the read high voltage VREADH, that of the voltage VSG, that of the voltage VSGD, and that of the voltage SGDVDD. In addition, a switching circuit LSHVX is provided to select one of the inputted voltages. Then, the selected one is outputted as a voltage SGD_Global.

Moreover, as FIG. 13C illustrates, a CG driver 90 receives the input of the read high voltage VREADH, and that of the voltage VSG. In addition, a switching circuit LSHVX is provided to select one of the inputted voltages. Then, the selected one is outputted as a voltage SGS_Global.

[3-3] Local Drivers/Row Decoders

Next, a description is given of local drivers connected to those drivers illustrated in FIGS. 12, and 13A to 13C, as well as the row decoders.

Figure 14:
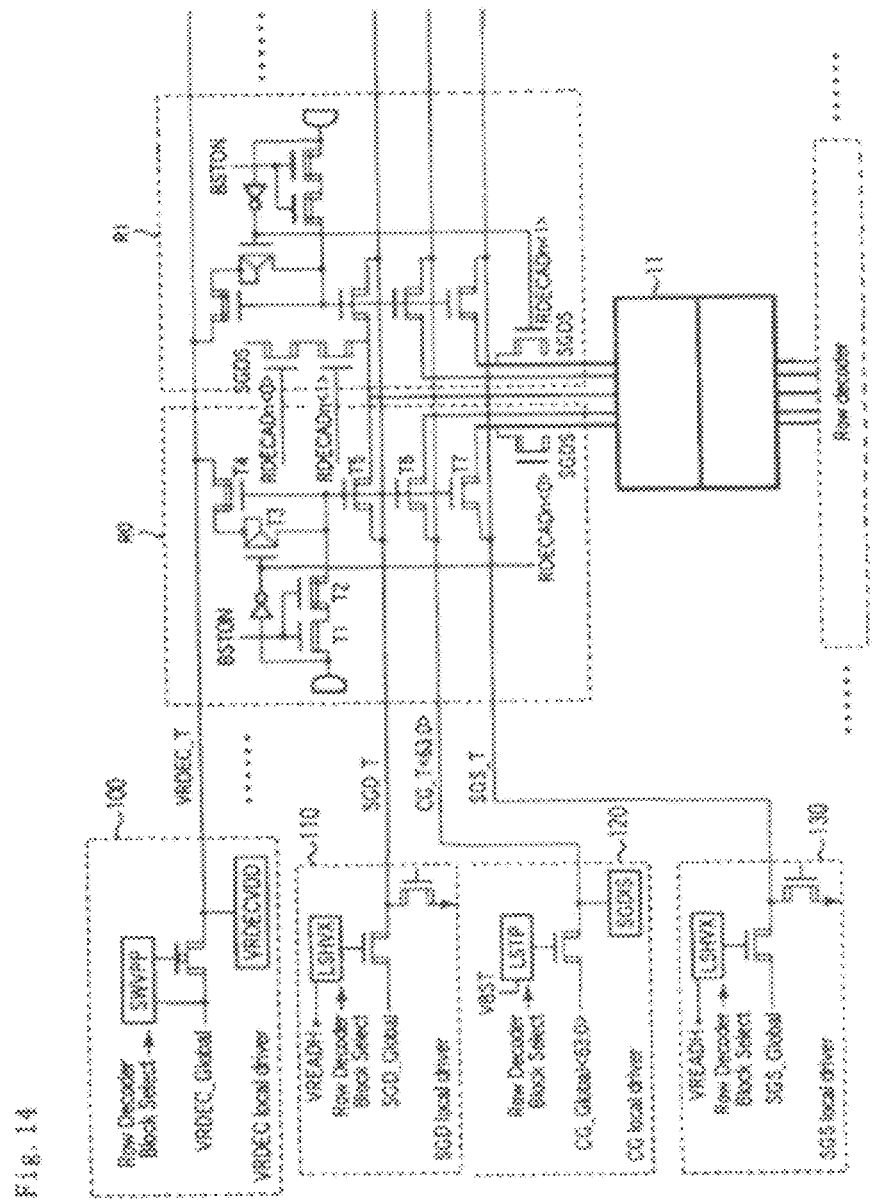
FIG. 14 is a diagram illustrating a local driver and row decoders according to the first and the second embodiments.

FIG. 14 is a diagram illustrating a local driver and row decoders according to the first and the second embodiments.

As FIG. 14 illustrates, a VRDEC local driver 100 receives the input of the voltage VRDEC_Global. A switching circuit SWVPP receives the input of a row-decoder block selection signal. If the block selection signal instructs the selection of a block, the switching circuit SWVPP is turned on, and outputs the voltage VRDEC_Global to a power line VRDEC_T. In contrast, if the block selection signal does not instruct the selection of any block, the switching circuit SWVPP is turned off while a circuit VRDECVDD is turned on to output the voltage VDD to the power line VRDEC_T.

In addition, a SGD local driver 110 receives the input of the voltage SGD_Global and that of the read high voltage VREADH. A switching circuit LSHVX receives the input of the read high voltage VREADH and that of the row-decoder block selection signal. If the block selection signal instructs the selection of a block, the switching circuit LSHVX is turned on, and outputs the voltage SGD_Global to a signal line SGD_T. In contrast, if the block selection signal does not instruct the selection of any block, the switching circuit LSHVX is turned off.

A CG local driver 120 receives the input of the voltage CG_Global and that of the voltage VBST. A switching circuit LSTP receives the input of the voltage VBST and that of the row-decoder block selection signal. If the block selection signal instructs the selection of a block, the switching circuit LSTP is turned on, and outputs the voltage CG_Global to a signal line CG_T. In contrast, if the block selection signal does not instruct the selection of any block, the switching circuit LSTP is turned off while a circuit SGDIS is turned on to output the voltage Vss to the signal line CG_T.

A SGS local driver 130 receives the input of the voltage SGS_Global and that of the read high voltage VREADH. A switching circuit LSHVX receives the input of the read high voltage VREADH and that of the row-decoder block selection signal. If the block selection signal instructs the selection of a block, the switching circuit LSHVX is turned on, and outputs the voltage SGS_Global to a signal line SGS_T. In contrast, if the block selection signal does not instruct the selection of any block, the switching circuit LSHVX is turned off.

Here, the power line VRDEC_T, and the signal lines CG_T, SGD_T, and SGS_T are connected to the row-decoder group corresponding to the selected block, and that the power line VRDEC_B, and the signal lines CG_B, SGD_B, and SGS_B are connected to the row-decoder group corresponding to the non-selected block. Note that FIG. 14 shows none of the power line VRDEC_B, the signal lines CG_B, SGD_B, and SGS_B, the local drivers for these, and the memory-cell array.

The power line VRDEC_T, and the signal lines CG_T, SGD_T, and SGS_T are connected to plural row decoders R0, R1, and so on. As described earlier by referring to FIG. 3, in the row decoder R0 corresponding to the selected block, transistors T5 to T7 are turned on, and thereby the voltage supplied to the power line VRDEC_T, and to the signal lines CG_T, SGD_T, and SGS_T is inputted to the memory cells and the selection transistors included in each block within a memory-cell array 11.

In contrast, for the power line VRDEC_B, and the signal line CG_B, SGD_B, and SGS_B connected to the row-decoder group corresponding to the non-selected block, the switching circuit in the local driver is turned off. Thus, the power line VRDEC_T, and signal lines CG_T, SGD_T, and SGS_T are turned to be in a cut-off state, that is, in the floating state.

[3-4] Layout of Signal Lines/Switching Circuits

FIG. 15A is a diagram illustrating the layout of signal lines CG according to the embodiment. FIGS. 15B and 15C are diagrams illustrating layouts of the switching circuits connected to the power lines and the signal lines.

As FIG. 15A illustrates, a small distance is secured between a signal line CG_T<i> and a signal line CG_B<i> (i is an integer, 0≦i≦63). However, the distance secured between the signal line CG_B<i> and a signal line CG_T<i+1>, is larger than the distance between the signal line CG_T<i> and the signal line CG_B<i>. To put it differently, the signal line CG_T<i> and the signal line CG_B<i>, which are selected by the same address, are close to each other, while the signal line CG_B<i> and the signal line CG_T<i+1>, which are selected by different addresses, are remote from each other. Accordingly, a reduction can be achieved in the coupling capacity between adjacent signal lines.

In addition, as FIG. 15B illustrates, a power line VRDEC_Global is connected to the power lines VRDEC_T via a switching circuit (transistor) T11 and to the power line VRDEC_B via a switching circuit (transistor) T12. The transistors T11 and T12 are formed on a substrate in a manner that the two transistors T11 and T12 share an end of the current path.

Likewise, as FIG. 15C illustrates, a signal line CG_Global is connected to the signal line CG_T via a switching circuit (transistor) T13 and to the signal line CG_B via a switching circuit (transistor) T14. The transistors T13 and T14 are formed on a substrate in a manner that the two transistors T13 and T14 share an end of the current path.

Accordingly, a reduction can be achieved in the area occupied by the transistor included in each switching circuit. In addition, a reduction can be achieved in the load for each pump.

As has been described thus far, the nonvolatile semiconductor memory device provided according to the embodiments can achieve a reduction in the area of each pump serving as a voltage supplier to the power lines and the like. In addition, the nonvolatile semiconductor memory device can also achieve a reduction in the stress on each switching circuit that transfers a voltage to the power lines and the like.

Note that the description of each of the embodiments described above took an NAND flash memory as an example. The present invention, however, is applicable to other memory devices including power lines. For example, the present invention is applicable to a resistive random access memory (ReRAM), or a nonvolatile semiconductor memory that relies on the bit cost scalable (BiCS) technique.

Hereinbelow, a brief description is given of a nonvolatile semiconductor memory that relies on the BiCS technique by referring to FIG. 16. FIG. 16 is a perspective view of an NAND flash memory that relies on the BiCS technique.

The NAND flash memory includes plural blocks, each of which is a data-erasure unit. FIG. 16 illustrates two blocks BK<i> and BK<i+1>.

A single source diffusion layer 24 is formed in a semiconductor substrate, and is shared by all the blocks, for example. The source diffusion layer 24 is connected to a source line SL·M1 via a contact plug PSL. Three or more conductive layers (six layers in FIG. 16), each of which is made of a conductive polysilicon or the like, are formed on the source diffusion layer 24.

Each of the lowest five conductive layers, i.e. all but the uppermost one, is formed in a plate-like shape within the area of the single block BK<i+1>, and the end portions, in the X-direction, of the five conductive layers are formed in a stair-like shape so that a contact can be made to each conductive layer. The lowermost layer serves as a source-line-side select-gate line SGS, while the four conductive layers not including the uppermost and lowermost ones serve as word lines WL<0>, WL<1>, WL<2>, and WL<3>.

The uppermost layer includes plural line-shaped conductive lines each of which extends in the X-direction. For example, six conductive lines are provided within the single block BK<i+1>. For example, the six conductive lines of the uppermost layer serve as bit-line-side select-gate lines SGD<0> to SGD<5>.

Each of plural active layers (active areas) AA to form a NAND cell unit is formed in a columnar shape that extends in the Z-direction (i.e. in a direction normal to the surface of the semiconductor substrate). Each active layer AA penetrates the plural conductive layers to reach source diffusion layer 24.

The top ends of the plural active layers AA are connected to plural bit lines BL<0> to BL<m>, each of which extends in the Y-direction. In addition, the source-line-side select-gate line SGS is connected, via a contact plug PSGS, to an extraction line SGS·M1 that extends in the X-direction. The word lines WL<0>, WL<1>, WL<2>, and WL<3> are connected, via contact plugs PWL<0>, PWL<1>, PWL<2>, and PWL<3> respectively, to extraction lines WL<0>·M1, WL<1>·M1, WL<2>·M1, and WL<3>·M1 respectively, each of which extends in the X-direction.

In addition, the bit-line-side select gate lines SGD<0> to SGD<5> are connected, via contact plugs PSGD<0> to PSGD<5> respectively, to extraction lines SGD<0>·M1 to SGD<5>·M1 respectively, each of which extends in the X-direction.

Each of the plural bit lines BL<0> to BL<m>, and the extraction lines SGS·M1, WL<0>·M1, WL<1>·M1, WL<2>·M1, and WL<3>·M1, and SGD<0>·M1 to SGD<5>·M1 is made, for example, of a metal. The NAND flash memory that relies on the BiCS technique has such a configuration as described above.

Some embodiments of the present invention have been described thus far. These embodiments are provided just as some examples, and do not intend to restrict the scope of the present invention. These novel embodiments can be carried out in other various forms. Various omissions, substitutions, modifications can be made without departing from the gist of the present invention. Such other embodiments and modifications are also included in the scope and the gist of the invention, and included in the invention defined in the claims and its equivalents.

What is claimed is:

1. A nonvolatile semiconductor memory device comprising:
   a memory-cell array including a plurality of memory cells connected to a plurality of word lines;
   a first row decoder and a second row decoder, both provided in a first region, and each configured to select a word line from the plurality of word lines;
   a first power line provided in the first region, and configured to transfer a first voltage to the first row decoder;
   a second power line provided in the first region, and configured to transfer the first voltage to the second row decoder;
   a first power-supply circuit configured to supply the first voltage to the first power line and to the second power line;
   a first switching circuit configured to switch between connection and disconnection between the first power line and the first power-supply circuit; and
   a second switching circuit configured to switch between connection and disconnection between the second power line and the first power-supply circuit, wherein
   in a write operation, the first switching circuit connects the first power line and the first power-supply circuit to each other whereas the second switching circuit disconnects the second power line and the first power-supply circuit from each other.

2. The nonvolatile semiconductor memory device according to claim 1, further comprising:
   a first signal line provided in the first region, and configured to transfer a second voltage to the word line selected by the first row decoder;
   a second signal line provided in the first region, and configured to supply the second voltage to the word line selected by the second row decoder;
   a second power-supply circuit configured to supply the second voltage to the first signal line and the second signal line;
   a third switching circuit configured to switch between connection and disconnection between the first signal line and the second power-supply circuit; and
   a fourth switching circuit configured to switch between connection and disconnection between the second signal line and the second power-supply circuit, wherein
   in the write operation, the third switching circuit connects the first signal line and the second power-supply circuit to each other, whereas the fourth switching circuit disconnects the second signal line and the second power-supply circuit from each other.

3. The nonvolatile semiconductor memory device according to claim 1, wherein
   in a write-verify operation after the write operation,
   at a first time point, the first switching circuit connects the first power line and the first power-supply circuit to each other whereas the second switching circuit connects the second power line and the first power-supply circuit to each other, thereby the first power line and the second power line are connected, and
   at a second time point after the first time point, the second switching circuit disconnects the second power line and the first power-supply circuit from each other whereas the first switching circuit continues to connect the first power line and the first power-supply circuit to each other.

4. The nonvolatile semiconductor memory device according to claim 2, wherein
   in the write operation,
   at a third time point before the first time point, the first switching circuit connects the first power line and the first power-supply circuit to each other whereas the second switching circuit disconnects the second power line and the first power-supply circuit from each other, and
   at a fourth time point after the third time point, the first switching circuit continues to connect the first power line and the first power-supply circuit to each other whereas the second switching circuit connects the second power line and the first power-supply circuit to each other.

5. The nonvolatile semiconductor memory device according to claim 1, wherein
   in a transition from the write operation to the write-verify operation, the first switching circuit and the second switching circuit electrically conduct between the first power line and the second power line, thereby equalizing the voltage of the first power line and the voltage of the second power line to each other, and
   in the write-verify operation, electrical charges accumulated in the second power line are moved to the first power line.

6. The nonvolatile semiconductor memory device according to claim 2, wherein
   in a transition from the write operation to the write-verify operation, the first switching circuit and the second switching circuit electrically conduct between the first power line and the second power line, thereby equalizing the voltage of the first power line and the voltage of the second power line to each other, and in the write-verify operation, electrical charges accumulated in the second power line are moved to the first power line.

7. The nonvolatile semiconductor memory device according to claim 6, wherein
in a transition from the write operation to the write-verify operation, the third switching circuit and the fourth switching circuit electrically conduct between the first signal line and the second signal line, thereby equalizing the voltage of the first signal line and the voltage of the second signal line to each other, and
in the write-verify operation, electrical charges accumulated in the second signal line are moved to the first signal line.

8. The nonvolatile semiconductor memory device according to claim 1, wherein
the memory-cell array includes a first block and a second block,
a first word line in the first block is selected by the first row decoder, and
a second word line in the second block is selected by the second row decoder.

9. The nonvolatile semiconductor memory device according to claim 8, wherein
a first group of the row decoder includes a plurality of the first row decoder,
a second group of the row decoder includes a plurality of the second row decoder, and
the first group of the row decoders and the second group of the row decoders are arranged in the first region.

10. The nonvolatile semiconductor memory device according to claim 9, wherein
the first group of the are arranged in a first-end side and the second group of the are arranged in a second-end side of the memory-cell array being opposite to the first-end side.

11. The nonvolatile semiconductor memory device according to claim 1, wherein
the first region is only arranged at one side of the memory cell array.

* * * * *